US012119204B2

(12) United States Patent
Schubert et al.

(10) Patent No.: US 12,119,204 B2
(45) Date of Patent: Oct. 15, 2024

(54) PARTICLE BEAM SYSTEM AND THE USE THEREOF FOR FLEXIBLY SETTING THE CURRENT INTENSITY OF INDIVIDUAL PARTICLE BEAMS

(71) Applicant: Carl Zeiss MultiSEM GmbH, Oberkochen (DE)

(72) Inventors: Stefan Schubert, Oberkochen (DE); Dirk Zeidler, Oberkochen (DE); Georgo Metalidis, Zang (DE); Hans Fritz, Grabs (CH); Ralf Lenke, Lauchheim (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 293 days.

(21) Appl. No.: 17/573,222

(22) Filed: Jan. 11, 2022

(65) Prior Publication Data

US 2022/0139665 A1    May 5, 2022

Related U.S. Application Data

(63) Continuation of application No. PCT/DE2020/000101, filed on May 23, 2020.

(30) Foreign Application Priority Data

Jul. 31, 2019    (DE) .......................... 102019005362.1

(51) Int. Cl.
*H01J 37/145*    (2006.01)
*H01J 37/10*    (2006.01)
(Continued)

(52) U.S. Cl.
CPC .......... *H01J 37/3177* (2013.01); *H01J 37/10* (2013.01); *H01J 37/145* (2013.01); *H01J 37/147* (2013.01);
(Continued)

(58) Field of Classification Search
CPC ...... H01J 37/3177; H01J 37/10; H01J 37/145; H01J 37/147; H01J 37/263; H01J 37/3023;
(Continued)

(56) References Cited

U.S. PATENT DOCUMENTS 4,130,761 A    12/1978    Matsuda
4,153,843 A    5/1979    Pease
(Continued)

FOREIGN PATENT DOCUMENTS

CN    102687232 A    9/2012
CN    104520968 A    4/2015
(Continued)

OTHER PUBLICATIONS

Translation of International Search Report for PCT Appl No. PCT/DE2020/000101, dated Oct. 26, 2020.
(Continued)

*Primary Examiner* — David E Smith
*Assistant Examiner* — Christopher J Gassen
(74) *Attorney, Agent, or Firm* — Fish & Richardson P.C.

(57) ABSTRACT

A particle beam system and, such as a multi-beam particle microscope, can have a current intensity of individual particle beams that is flexibly set over large value ranges without structural modifications. The particle beam system can include a condenser lens system, a pre-multi-lens array with a specific pre-counter electrode and a pre-multi-aperture plate, and a multi-lens array. The system can includes a controller to supply adjustable excitations to the condenser lens system and the pre-counter electrode so that the charged particles are incident on the pre-multi-aperture plate in telecentric manner.

21 Claims, 12 Drawing Sheets

(51) Int. Cl.
  *H01J 37/147* (2006.01)
  *H01J 37/26* (2006.01)
  *H01J 37/302* (2006.01)
  *H01J 37/317* (2006.01)

(52) U.S. Cl.
  CPC ........ *H01J 37/263* (2013.01); *H01J 37/3023* (2013.01); *H01J 2237/0453* (2013.01); *H01J 2237/04926* (2013.01)

(58) Field of Classification Search
  CPC ..... H01J 2237/0453; H01J 2237/04926; H01J 37/265; H01J 37/28; H01J 2237/0455; H01J 2237/04924; H01J 2237/04928; H01J 2237/1205; H01J 2237/1215; H01J 37/12; H01J 37/09
  See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,014,200 A * | 1/2000 | Sogard ............... H01J 37/3174 355/53 |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,916,837 B2 | 12/2014 | Dinu-Gurtler et al. |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,384,938 B2 | 7/2016 | Zeidler et al. |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,037,864 B2 | 7/2018 | Van Veen et al. |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,403,469 B2 | 9/2019 | Lazic et al. |
| 10,453,645 B2 | 10/2019 | Frosien et al. |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2009/0014649 A1 | 1/2009 | Nakasuji |
| 2009/0114818 A1* | 5/2009 | Casares ............... H01J 37/09 250/306 |
| 2011/0260040 A1 | 10/2011 | Wieland et al. |
| 2012/0305798 A1 | 12/2012 | Zonnevylle et al. |
| 2013/0187046 A1* | 7/2013 | Zeidler .............. B82Y 40/00 250/440.11 |
| 2014/0197325 A1 | 7/2014 | Kato |
| 2015/0008331 A1* | 1/2015 | Kemen ............... H01J 37/147 250/307 |
| 2015/0069235 A1 | 3/2015 | Kemen et al. |
| 2015/0255249 A1 | 9/2015 | Ogasawara |
| 2016/0189916 A1* | 6/2016 | Frosien ............... H01J 37/28 250/396 R |
| 2017/0025241 A1 | 1/2017 | Li et al. |
| 2017/0133198 A1 | 5/2017 | Kruit |
| 2017/0338078 A1 | 11/2017 | Jiruse et al. |
| 2019/0333732 A1 | 10/2019 | Ren |
| 2020/0027687 A1* | 1/2020 | Cook .................. H01J 37/244 |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | |
|---|---|---|
| DE | 10 2013 014 976 A1 | 3/2015 |
| DE | 10 2017 110 993 A1 | 11/2017 |
| DE | 10 2019 005 362 A1 | 2/2021 |
| GB | 2519511 A | 4/2015 |
| GB | 2521819 A | 7/2015 |
| JP | 57-130354 A | 8/1982 |
| JP | 59184524 A | 10/1984 |
| JP | 60042825 A | 3/1985 |
| JP | 60105229 A | 6/1985 |
| JP | 61263217 A | 11/1986 |
| JP | 08-138611 A | 5/1996 |
| JP | 2001052997 A * | 2/2001 |

(56) References Cited

FOREIGN PATENT DOCUMENTS

| | | |
|---|---|---|
| JP | 2005-302868 A | 10/2005 |
| JP | 2006-080304 A | 3/2006 |
| JP | 2006-140267 A | 6/2006 |
| JP | 2007-513460 A | 5/2007 |
| JP | 2009-032691 A | 2/2009 |
| JP | 2009-507351 A | 2/2009 |
| JP | 2013-251225 A | 12/2013 |
| JP | 2014229481 A | 12/2014 |
| JP | 2016-207651 A | 12/2016 |
| JP | 2018-528596 A | 9/2018 |
| TW | 201802857 A | 1/2018 |
| TW | 201833968 A | 9/2018 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 | 5/2007 |
| WO | WO 2011/124352 | 10/2011 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |
| WO | WO 2021/018327 A1 | 2/2021 |

OTHER PUBLICATIONS

Japanese Office Action, with translation thereof, for corresponding JP Appl No. 2022-506262, dated Jan. 30, 2023.

* cited by examiner

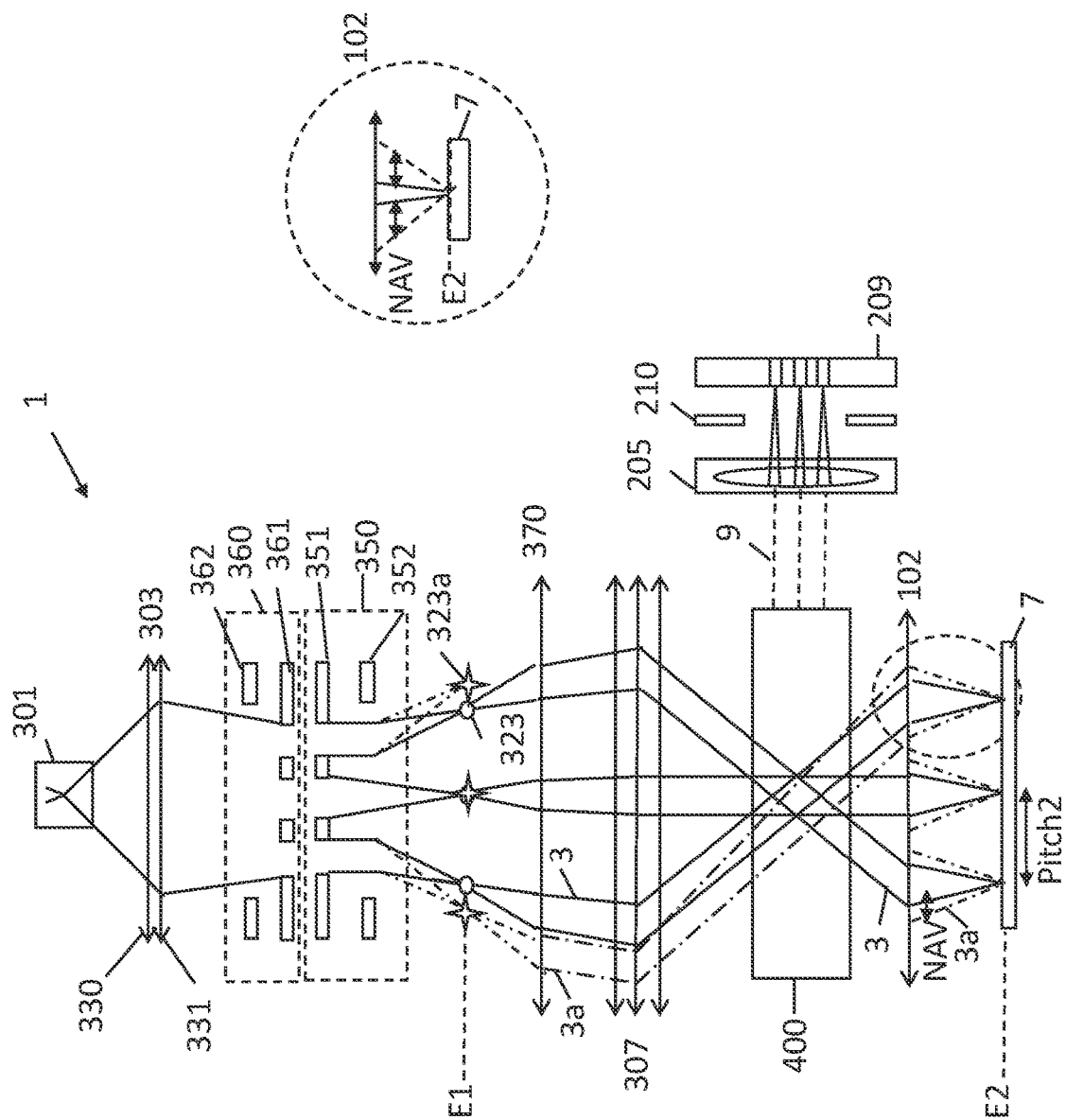

PARTICLE BEAM SYSTEM AND THE USE THEREOF FOR FLEXIBLY SETTING THE CURRENT INTENSITY OF INDIVIDUAL PARTICLE BEAMS

CROSS-REFERENCE TO RELATED APPLICATIONS

The present application is a continuation of, and claims benefit under 35 USC 120 to, international application PCT/DE2020/000101, filed Mar. 23, 2020, which claims benefit under 35 USC 119 of German Application No. 10 2019 005 362.1, filed Jul. 31, 2019. The entire disclosure of these applications are incorporated by reference herein.

FIELD

The disclosure relates to particle beam systems which operate with a multiplicity of particle beams.

BACKGROUND

Similar to single-beam particle microscopes, multi-beam particle microscopes can be used to analyze objects on a microscopic scale. Images of an object that represent a surface of the object, for example, can be recorded using these particle microscopes. In this way, for example the structure of the surface can be analyzed. While in a single-beam particle microscope an individual particle beam of charged particles, such as electrons, positrons, muons or ions, for example, is used to analyze the object, in a multi-beam particle microscope, a multiplicity of particle beams are used for this purpose. The multiplicity of the particle beams, also referred to as a bundle, are directed onto the surface of the object at the same time, allowing for the possibility of a significantly larger area of the surface of the object to be sampled and analyzed compared to a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams can be generated by an electron beam generated by an electron source being directed onto a multi-aperture plate having a multiplicity of openings. One portion of the electrons of the electron beam can strike the multi-aperture plate and is absorbed there, and another portion of the beam can pass through the openings in the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate can have the effect that each opening in the multi-aperture plate acts as a lens on the electron beam passing through the opening, such that the electron beams can be focused in a plane situated at a distance from the multi-aperture plate. The plane in which the foci of the electron beams are formed can be imaged by a downstream optical unit onto the surface of the object to be examined, such that the individual electron beams strike the object in a focused manner as primary beams. There they can generate interaction products, such as backscattered electrons or secondary electrons, emanating from the object, which can be shaped to form secondary beams and are directed onto a detector by a further optical unit. There each of the secondary beams can strike a separate detector element such that the electron intensities detected by the detector element can provide information relating to the object at the site at which the corresponding primary beam strikes the object. The bundle of primary beams can be scanned systematically over the surface of the object in order to generate an electron micrograph of the object in the manner that is customary for scanning electron microscopes.

A high resolution within the scope of the particle-optical imaging in the described multiple particle beam system is, in general, highly relevant in practice. The resolution can depend on the numerical aperture in the object plane and on the beam current of the individual particle beams. In general, on account of diffraction, the following applies to an aberration-free optical unit: The larger the numerical aperture of the object plane, the better the resolution, since this allows a smaller illumination spot to be obtained in the object plane. The smaller the beam current of an individual particle beam, in general, the better the resolution. Here, the values of numerical aperture and of the beam current of the individual particle beams can be closely related or linked to one another by way of the imaging scale. Aberrations can be additional factors influencing the resolution, with these contributions generally depending on the numerical aperture in different ways. At a given working point, in particular at a specified beam current, and at set system parameters (e.g., aberration coefficients, magnification of the image representation of source, beam current), there can be a value for the numerical aperture at the sample, for which the spot size of the individual particle beams on the object is minimized. Here, the numerical aperture is typically only optimized for one working point of the system and, here too, the numerical aperture might not be optimal for this one working point, despite all the calculations.

SUMMARY

In general, it is desirable to be able to alter the numerical aperture of the multiple particle beam system. This would allow an improvement in, or optimization of, the resolution during operation. Moreover, it is generally desirable to improve or optimize the resolution for a specified working point and, for example, for a specified beam current intensity or else, conversely, to set the beam current intensity continuously and as flexibly as possible over large value ranges for a desired resolution, where possible without having to make structural modifications to the multiple particle beam system.

The present disclosure seeks to provide a particle beam system which allows the respective optimum of beam current and numerical aperture to be set for an optimal resolution, independently and over large value ranges, for example in a simple fashion and without making structural modifications to the particle beam system. Here, it should be possible, but not mandatory, to alter other particle-optical parameters such as, for example, the distance between individual particle beams upon incidence on the sample (the so-called "pitch").

According to a first aspect, the disclosure provides a particle beam system including the following: at least one particle source, which is configured to generate a divergent beam of charged particles; a condenser lens system, which is passed through by the beam of charged particles; a pre-multi-lens array, wherein the pre-multi-lens array has a pre-counter electrode with a central opening, through which the beam of charged particles passes, and wherein the pre-multi-lens array has a pre-multi-aperture plate disposed in the beam path downstream of the pre-counter electrode, the pre-multi-aperture plate being arranged in such a way that the charged particles pass through the pre-multi-aperture plate in the form of a multiplicity of charged individual particle beams; a multi-lens array, which is arranged in the beam path downstream of the pre-multi-lens array, wherein the multi-lens array has a multi-aperture plate with a multiplicity of openings through which at least a portion of the charged individual particle beams passes, and wherein the multi-lens array has a counter electrode in the beam path downstream of the multi-aperture plate with a central opening disposed, the counter electrode being substantially passed through by the multiplicity of individual particle beams; and a controller, which is configured to supply adjustable excitations to the condenser lens system and the pre-counter electrode in such a way that the charged particles are able to be incident on the pre-multi-aperture plate in telecentric fashion.

The controller can be configured to set the current intensity of the individual particle beams.

A particle source is provided, although a plurality of particle sources could also be provided. The charged particles can be, e.g., electrons, positrons, muons or ions or other charged particles. The charged particles can be electrons generated, e.g., using a thermal field emission source (TFE). However, other particle sources can also be used.

The condenser lens system can have one, two or more condenser lenses. The condenser lens system can have a double condenser. The condenser lens system can include exactly two condenser lenses, such as two magnetic condenser lenses.

Within the scope of this patent application, linguistic distinction is made throughout between multi-aperture plates on the one hand and multi-lens arrays on the other hand. A multi-aperture plate is a plate with a multiplicity of openings. Here, a voltage could be applied to this multi-aperture plate overall. This could but need not be the case. In general, all openings in a multi-aperture plate have a uniform, globally identical electric and magnetic potential. Within the scope of this patent application, a multi-lens array has a multiplicity of lenses disposed substantially parallel to one another, the refractive powers of which can be varied. The lens effect can be generated by a combination of multi-aperture plate and counter electrode and the refractive power of the lenses can be varied, for example, by different excitations of the counter electrode.

The multi-lens array forms a portion of a particle beam system with a multiplicity of individual particle beams. Here, the multi-lens array includes a multi-aperture plate and a counter electrode. The individual particle beams are, in general, generated no later than during the passage through the multi-lens array and the individual particle beams are respectively focused downstream of the multi-lens array. The foci arising in the process correspond to a plurality of images of the particle source and can subsequently be considered to be initial points or a virtual multi-source array for the subsequent particle-optical imaging. Here, the focusing effect of the multi-lens array can arise from different electric field strengths upstream and downstream of the multi-aperture plate and the counter electrode with its central opening arranged downstream of the multi-aperture plate in the beam path furthermore ensures that the individual particle beams are pulled apart or that the foci of the individual particle beams are spaced further apart from one another than the individual openings of the multi-aperture plate.

Furthermore, arranging a pre-multi-aperture plate in the beam path upstream of the multi-lens array is known, with this pre-multi-aperture plate then serving to shape the individual particle beams or to cut these out of the beam of charged particles. Arranging a pre-multi-aperture plate upstream of the multi-lens array can be desirable because the multi-aperture plate of the multi-lens array is not charged by particles incident thereon; nevertheless, some known particle beam systems can also operate without the pre-multi-aperture plate. However, according to the disclosure, a pre-multi-aperture plate is provided; which is a functional constituent part of the pre-multi-lens array.

According to certain conventional approaches, the current intensity of individual particle beams is now set as follows: The condenser lens system is excited differently. In the process, the original divergent beam of charged particles is collimated by the condenser lens system and these collimated beams are incident on the multi-lens array or a pre-multi-aperture plate possibly arranged upstream thereof. Thus, strictly speaking, the condenser lens system can be considered a collimation lens system. Here, depending on the excitation of the condenser lens system, the overall beam of charged particles can have a different beam diameter. This means that the current or the beam current density apportioned to an individual particle beam can be varied by way of the settings of the condenser lens system. However, the range over which such a variation of the resultant beam current density can be implemented is, in general, limited in a multiple particle beam system for structural reasons. A more pronounced variation to small currents generally involves significantly increasing the focal length of the condenser lens system; this would be impossible within existing systems and, even otherwise, would be associated with significant structural measures (increasing the ceiling height of the laboratories). Now, this is the starting point of the present disclosure:

In addition to the condenser lens system known per se and the multi-lens array known per se, the particle beam system according to the disclosure has a pre-multi-lens array, which can be constructed as follows: The pre-multi-lens array can have a pre-counter electrode with a central opening, through which the beam of charged particles passes. Moreover, the pre-multi-lens array can have a multi-aperture plate arranged in the beam path downstream of the pre-counter electrode, the multi-aperture plate can be arranged in such a way that the charged particles pass through the pre-multi-aperture plate in the form of a multiplicity of charged individual particle beams. This pre-multi-aperture plate could be a pre-multi-aperture plate already known per se already present. However, it is generally desirable that the pre-counter electrode is combined with the pre-multi-aperture plate to form the pre-multi-lens array and that an adjustable voltage can be applied to the pre-counter electrode. Consequently, in the totality thereof, the pre-multi-lens array also can have a focusing effect on the charged individual particle beams passing therethrough. At the same time, a global lens field can arise in the region of the pre-counter electrode, with the global lens field being able to act on the beam of charged particles passing through the condenser lens system. As a result, the irradiation conditions of the condenser lens system can be varied over a wide range since, according to the disclosure, the beam of charged particles need not be collimated following the passage through the condenser lens system. Instead, the charged particle beam can enter the global lens field of the pre-counter electrode in convergent or divergent fashion following the passage through the condenser lens system. The controller which supplies adjustable excitations, i.e., voltages and/or currents, to the condenser lens system and the pre-counter electrode can allow these excitations to be chosen in such a way that the charged particles can satisfy the telecentricity condition upon incidence on the pre-multi-aperture plate. Meeting this telecentricity condition can be desirable for the quality of the particle-optical imaging in the subsequent beam path through the particle beam system since this simplifies the construction of the particle-optical components. By setting appropriate voltages at the condenser lens system and at the pre-counter electrode, it is possible to vary the beam current of the individual particle beams without structural modifications/lengthening of the column. Here, an effect of the feature combination according to the disclosure can be the change in the effective numerical aperture of the source for current changing purposes. Thus, what can be decisive in this image is the emission angle/solid angle of the particle source from which an individual particle beam obtains its charged particles in each case. Thus, the particle beam system according to the disclosure renders it possible to configure the controller in such a way that the current intensity of the individual particle beams becomes adjustable over a wider range without structural modifications of the system.

The openings of the pre-multi-aperture plate and of the multi-aperture plate of the multi-lens array can have the same diameter; however, it is also possible that these have different diameters. Here, for example, the diameter of the apertures of the pre-multi-aperture plate can be smaller than the diameter of the apertures of the multi-aperture plate of the multi-lens array. The openings of the pre-multi-aperture plate and of the multi-aperture plate of the multi-lens array can be circular and, overall, the individual openings are arranged in a hexagonal structure; however, other arrangement options are also possible. Generally, the number of openings in the pre-multi-aperture plate and in the multi-aperture plate is matched to the number of individual particle beams. It can be desirable for the number of particle beams to be $3n(n-1)+1$, where n is any natural number, in the case of a hexagonal arrangement.

According to an embodiment of the disclosure, the particle beam system can have a micro-optical unit, which includes the multi-lens array. According to an embodiment, the micro-optical unit also includes the pre-multi-aperture plate. In general, the micro-optical unit is an assembly of particle-optical elements, which are combined in the micro-optical unit. Here, the assembly can have a specific holder for the assembly or a common frame for the assembly. In so doing, the micro-optical unit can also have further particle-optical components. Examples of this are, e.g., multi-stigmators or other multi-lens arrays, wherein the lens effects of the individual openings of multi-aperture plates can also be set individually for each individual particle beam where desired, for example for the individual correction of a focal length of individual particle beams for correcting a possibly present field curvature. Components other than those mentioned can also be a constituent part of the micro-optical unit.

The pre-counter electrode of the pre-multi-lens array, by contrast, is normally not a constituent part of the micro-optical unit as an assembly. Typical distances between the individual elements of the micro-optical unit are between approximately 50 μm and approximately 1 mm. By contrast, the pre-counter electrode is typically spaced further apart from the pre-multi-aperture plate; the distance A is approximately 3 mm≤A≤30 mm, such as 5 mm≤A≤20 mm, for example A=6 mm.

According to an embodiment of the disclosure, the micro-optical unit has a frame which is at ground potential. Typically, the pre-multi-aperture plate and the multi-aperture plate of the multi-lens array are also at ground potential. By contrast, voltages in the region of a few kilovolt, e.g., +−12 kV, +−15 kV, +−16 kV or +−20 kV, are typically applied to the counter electrode or the pre-counter electrode.

Instead of a frame of a micro-optical unit at ground potential, the particle beam system according to an embodiment can have an pre-auxiliary electrode with a central opening, which is disposed in the beam path downstream of the pre-counter electrode and just upstream of the pre-multi-aperture plate and which is suppliable with an adjustable voltage via the controller. This can allow for varying of the global lens field or the focusing caused thereby and, overall, the provision of further variation options for the particle-optical imaging by the particle beam system. The focus position of the virtual particle sources and the pitch of the individual particle beams in the intermediate image can then be varied even more flexibly in the process. Moreover, it is possible to correct a field curvature.

Analogously, it is additionally or alternatively possible that the particle beam system moreover has a post-auxiliary electrode with a central opening, which is disposed in the beam path just downstream of the multi-aperture plate and upstream of the counter electrode and which is suppliable with an adjustable voltage via the controller.

The chosen distance between the pre-auxiliary electrode and the pre-multi-aperture plate and the distance between the post-auxiliary electrode and the multi-aperture plate can influence the strength of the additional adjustment options due to excitations or voltages applied to the pre-auxiliary electrode or to the post-auxiliary electrode. In general, the smaller the distance, the bigger the sensitivity when implementing settings, for example in view of an adjustment for field curvature correction and in view of telecentricity. Therefore, the smallest distance that is still realizable from a structural point of view, i.e., approximately 50 μm to approximately 1 mm, can be chosen between the pre-auxiliary electrode and the pre-multi-aperture plate. Then, a voltage applied to the pre-auxiliary electrode can be between approximately −1000 V and +1000 V.

The distance between the post-auxiliary electrode and the multi-aperture plate can be slightly larger than the distance between the pre-auxiliary electrode and the pre-multi-aperture plate. Then, the voltage applied to the post-auxiliary electrode can be chosen to be approximately the mean value between a voltage applied to the counter electrode and ground potential. This can be desirable because, generally, the correction of a field curvature can be set by way of the excitation of the pre-auxiliary electrode and the pitch can be set using the post-auxiliary electrode. Other arrangements of the distances and excitations, and consequently other adjustment options, are also possible.

According to an embodiment of the disclosure, the condenser lens system has two condenser lenses. Both condenser lenses can be magnetic condenser lenses.

Alternatively, the condenser lens system can have exactly one magnetic condenser lens and one electrostatic condenser lens, wherein the electrostatic condenser lens can be arranged in the beam path downstream of the magnetic condenser lens, and wherein a booster electrode, which is drivable by the controller, is arranged between the magnetic condenser lens and the electrostatic condenser lens, the latter being excitable by the booster electrode. In combination with the pre-counter electrode and the lower end of the booster electrode, a variable electrostatic lens can be formed, which acts as a lower condenser lens. Together with the cathode of the emitter and a magnetic lens, the upper end of the booster electrode, at the top, can form the fields for the upper condenser lens.

According to an embodiment of the disclosure, the particle beam system further has a beam current-restricting multi-aperture plate system including a beam current-restricting multi-aperture plate with a multiplicity of openings, wherein the beam current-restricting multi-aperture plate system is arranged in the beam path between the pre-multi-lens array and the multi-lens array and embodied to be insertable into the beam path. Sufficient installation space for arranging a variably employable multi-aperture plate system can be available between the pre-multi-lens array and the multi-lens array. The insertability can be realized with the aid of a mechanical actuator. Here, the beam current-restricting multi-aperture plate system can be used to once again limit the beam current reaching the pre-multi-aperture plate and the subsequent particle-optical unit. Here, big flexibility or variability can be achievable by way of the insertability of the beam current-restricting multi-aperture plate system. Here, the beam current-restricting multi-aperture plate system can have exactly one beam current-restricting multi-aperture plate; however, the multi-aperture plate system could also have two or more beam current-restricting multi-aperture plates. From the mechanical point of view, it is possible to achieve a positioning accuracy of a beam current-restricting multi-aperture plate of the order of approximately one micrometre. Using the beam current-restricting multi-aperture plate system, it is possible to vary or reduce the current intensity approximately up to a further factor of 10. However, the diffraction error in the case of small apertures and the lens errors in the case of large apertures could reduce the obtainable resolution over the current variation range. The disclosure can facilitate minimization of the resolution variation and optimization of the resolution.

In general, a beam current-restricting multi-aperture plate can also be fixedly arranged between the pre-multi-lens array and the multi-lens array. The beam current-restricting multi-aperture plate can be at ground potential.

According to an embodiment, the openings of the at least one beam current-restricting multi-aperture plate are formed in a circular and/or annular manner. Compared to circular openings, annular openings can be desirable because the numerical aperture does not change or does not become smaller here. Generally, a central maximum in the diffraction pattern of an annular opening is even narrower than the diffraction pattern of a conventional circular opening; however, higher secondary maxima can arise in the case of an annular opening. An aperture can also have a plurality of annular rings, possibly in addition to a central smaller circular opening.

According to an embodiment, the beam current-restricting multi-aperture plate system has two multi-aperture plates which are displaceable in substantially parallel fashion relative to one another, each with a multiplicity of openings, such that an effective multi-aperture plate opening size is adjustable for the individual particle beams passing through the beam current-restricting multi-aperture plate system. Here, it can be desirable for the openings of the two multi-aperture plates displaceable relative to one another have a substantially identical size and have substantially the same geometric form. As a result, the size of a resultant multi-aperture plate opening can be easily adjustable when displacing the two multi-aperture plates over one another or relative to one another and it is possible to choose the relative movement in such a way that the form of the resultant multi-aperture plate opening does not change in the process. Moreover, the provision of identical openings can simplify the manufacture of the multi-aperture plates.

According to an embodiment, the openings of the multi-aperture plates displaceable relative to one another are circular or square. In the case of square apertures, the plates can be displaced relative to one another within the XY-plane should Z denote the central optical axis of the system. The resultant multi-aperture plate opening can then have the same form as the respective openings of the multi-aperture plates; specifically, it can likewise be square. If a displacement process is carried out differently, the resultant opening could represent a rectangle or even a triangle (twisting of the plates relative to one another); however, this is generally not be desirable. If the openings of the two multi-aperture plates displaceable in substantially parallel fashion relative to one another are circular, a so-called lens shape, which is approximately elliptical, can arise as effective multi-aperture plate opening. On account of the substantially elliptical resultant individual particle beam, a multi-stigmator can be desirable in the further course of the beam path for correcting the astigmatism resulting from the elliptical beam profile.

According to a further embodiment, the beam current-restricting multi-aperture plate system has two or more multi-aperture plates disposed sequentially in the beam path, each with a multiplicity of openings, wherein two deflectors are disposed between the two multi-aperture plates and are drivable in such a way that a parallel offset of individual particle beams with respect to the optical axis is substantially obtainable during the passage through the multi-aperture plate system. Here, the two multi-aperture plates can be of identical construction and their openings lie, in particular exactly, over one another in the Z-direction or beam current direction. If the two deflectors are deactivated, a particle beam can pass through the two multi-aperture plates substantially in unimpeded fashion; i.e., substantially all particles of the individual particle beams can pass the sequence of the two multi-aperture plates. By contrast, if the two deflectors are activated, the parallel offset can cause the situation where individual particle beams only partly pass through the multi-aperture plate arranged further downstream in the beam path. Parts of the individual particle beams can strike the multi-aperture plate arranged further downstream in the beam path and are absorbed or are no longer available for the individual particle beams in the further course. This also can allow even further variation of the current intensity of the individual particle beams.

According to a further embodiment of the disclosure, the particle beam system moreover has the following:
an intermediate image plane which is arranged downstream of the multi-lens array in the direction of the beam path and in which real foci of the individual particle beams are formed, the foci being spaced apart by a pitch 1;
a field lens system which is arranged downstream of the intermediate image plane in the direction of the beam path;
an objective lens, in particular a magnetic objective lens, which is arranged downstream of the field lens system in the direction of the beam path; and
an object plane, into which the individual particle beams are particle-optically imaged and in which the individual particle beams are spaced apart by a pitch 2. Thus, the particle beam system according to the disclosure can be combined with the remaining components of already known multiple particle beam systems and, in particular, with known multiple particle microscopes.

The controller of the particle beam system according to the disclosure can be configured to drive the particle-optical components of the particle beam system in such a way that the pitch 2 can be set in the object plane and, for example, can be kept constant in the case of different beam current intensities of the individual particle beams. For such an adjustment, the particle beam system according to the disclosure can involve sufficient degrees of freedom or particle-optical components, which can be varied independently of one another. This can be desirable, for example, against the background that the beam spacing or pitch of the scanning arrangement of the multiplicity of individual particle beams over the chosen multi-aperture plates is, in general, fixedly predetermined in the case of multi-beam particle beam systems. Here, the pitch and the numerical aperture are coupled to one another and cannot be altered independently of one another per se. If a multiplicity of individual particle beams is imaged by a common optical unit, the change in a numerical aperture generally leads to a change in the pitch, which is undesirable. Therefore, conventional multi-beam particle microscopes do not allow changing the numerical aperture without changing the pitch at the same time. Instead, a further particle-optical component, which introduces an additional degree of freedom into the system, is involved for such settings. By way of example, this can be an additional field lens. A conventional multi-beam particle microscope with a field lens system consisting of three field lenses can be supplemented, for example, by a fourth field lens outside of the field lens system. The provision of an additional global lens field, for which the Helmholtz-Lagrange invariant is satisfied, is important in this case.

According to a further embodiment of the disclosure, the controller is configured to drive the particle-optical components of the particle beam system in such a way that the numerical aperture in the object plane is adjustable and the resolution of the imaging in the object plane is optimizable, in particular for a specified beam current intensity. The controller can be configured to drive the particle-optical components in such a way that other parameters of the particle-optical imaging, such as a focus, rotation and/or telecentricity in the object plane are likewise adjustable. The controller can be configured in such a way that the values of these other particle-optical parameters can be kept constant when changing the beam current intensity and/or the numerical aperture in the object plane.

In an aspect, the disclosure relates to a use of a particle beam system as described above for setting the current intensity of individual particle beams. Setting the current intensity of the individual particle beams in this case can open up multifaceted options for varying other parameters of particle-optical imaging and, for example, it can allow switching the operation of a particle beam system between a low resolution on the one hand and a high resolution on the other hand since the resolution depends very strongly on the beam current.

In an aspect, the disclosure relates to the use of the particle beam system as described above for setting a resolution, for example an optimal resolution, in an object plane. As already explained, the beam current, the numerical aperture, the spacing of the individual particle beams in the object plane, and the imaging scale of the image representation of the source can be closely related to one another. Here, the use of the particle beam system according to the disclosure can offer particularly good flexibility and facilitates setting of, for example, an optimal resolution, even in the case of the predetermined beam current of the individual particle beams.

In an aspect, the disclosure relates to a multi-beam particle microscope with a particle beam system as described above. The particle beam system according to the disclosure can thus be supplemented by the components of a multi-beam particle beam microscope known per se; for example, this includes any known detection unit. With respect to the details, reference is made, for example, to WO 2015 024 881 A2, which has already been cited.

BRIEF DESCRIPTION OF THE DRAWINGS

The disclosure can be understood even better with reference to the accompanying figures, in which:

FIG. 12 schematically shows a multi-beam particle microscope with particle-optical components for setting an optimal resolution.

DETAILED DESCRIPTION

Figure 1:
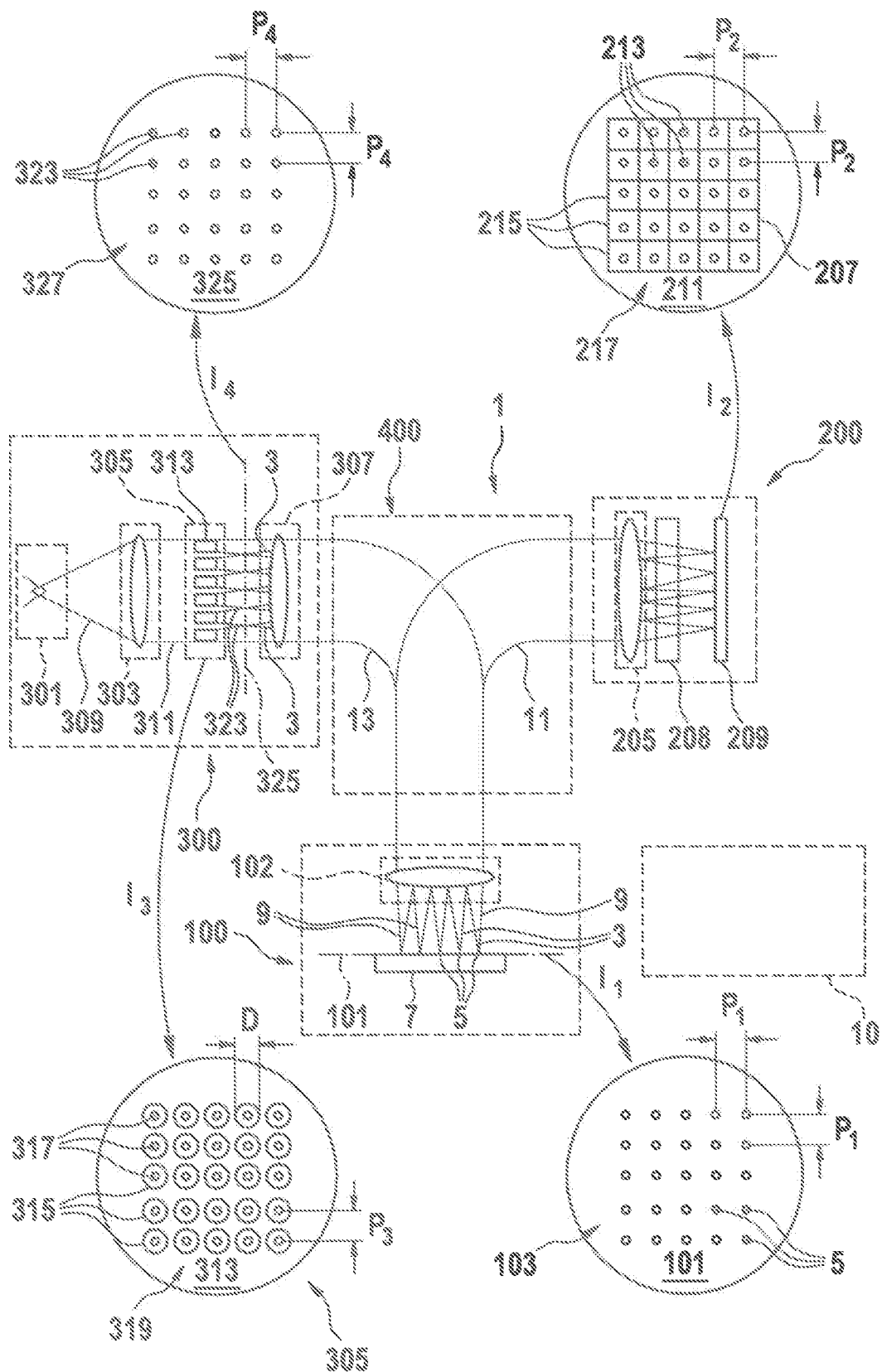
FIG. 1 shows a schematic illustration of a multi-beam particle microscope.

FIG. 1 is a schematic illustration of a particle beam system 1 in the form of a multi-beam particle microscope 1, which uses a multiplicity of particle beams. The particle beam system 1 generates a multiplicity of particle beams which strike an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of sites 5 and generate there a plurality of electron beam spots, or spots, that are spatially separated from one another. The object 7 to be examined can be of any desired type, e.g. a semiconductor wafer or a biological sample, and include an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of sites of incidence 5 formed in the first plane 101. In FIG. 1, the number of sites of incidence is 25, which form a 5×5 field 103. The number 25 of sites of incidence is a number chosen for reasons of simplified illustration. In practice, the number of beams, and hence the number of sites of incidence, can be chosen to be significantly greater, such as, for example, 20×30, 100×100 and the like.

In the embodiment illustrated, the field 103 of sites of incidence 5 is a substantially regular rectangular field having a constant pitch $P_1$ between adjacent sites of incidence. Exemplary values of the pitch $P_1$ are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles impinging the object generate interaction products, e.g. secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 includes a particle-optical unit having a projection lens 205 for directing the secondary particle beams 9 onto a particle multi-detector 209.

The excerpt $I_2$ in FIG. 1 shows a plan view of the plane 211, in which individual detection regions of the particle multi-detector 209 on which the secondary particle beams 9 are incident at sites 213 are located. The sites of incidence 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generating apparatus 300 including at least one particle source 301 (e.g., an electron source), at least one collimation lens 303, a multi-aperture arrangement 305 and a field lens 307, or a field lens system made of a plurality of field lenses. The particle source 301 generates a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are disposed in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which strike the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle-optical unit for imaging the plane 325, in which the beam foci 323 are formed, onto the first plane 101 such that a field 103 of sites of incidence 5 or beam spots arises there. Should a surface of the object 7 be arranged in the first plane, the beam spots are correspondingly formed on the object surface.

The objective lens 102 and the projection lens arrangement 205 provide a second imaging particle-optical unit for imaging the first plane 101 onto the detection plane 211. The objective lens 102 is thus a lens which is part of both the first and the second particle-optical unit, while the field lens 307 belongs only to the first particle-optical unit and the projection lens 205 belongs only to the second particle-optical unit.

A beam switch 400 is disposed in the beam path of the first particle-optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the application numbers DE 10 2013 016 113.4 and DE 10 2013 014 976.2, the disclosure of which in the full scope thereof is incorporated by reference in the present application.

The multiple particle beam system furthermore has a computer system 10 configured both for controlling the individual particle-optical components of the multiple particle beam system and for evaluating and analyzing the signals obtained by the multi detector 209. In this case, the computer system 10 can be constructed from a plurality of individual computers or components. It can also contain the controller according to the disclosure.

The constituent parts of the particle beam system according to the disclosure can be integrated into this multiple particle beam system.

Figures 2A, 2B, 2C:
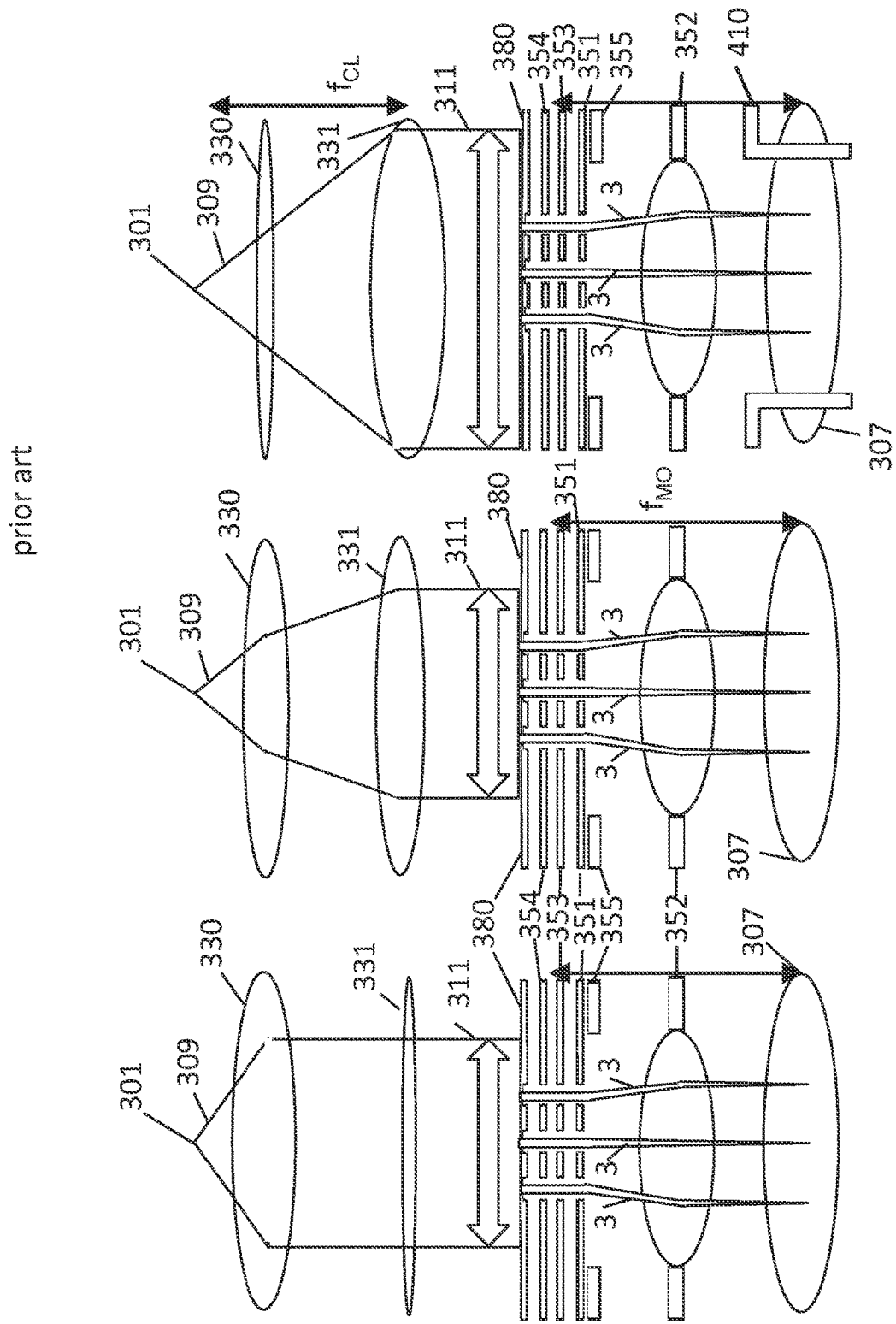
FIGS. 2A-2C schematically illustrate a current variation via condenser lenses in accordance with the prior art.

FIGS. 2A-2C schematically illustrate a current variation via condenser lenses in accordance with the prior art. An excerpt of a particle beam system such as, e.g., a multi-beam particle microscope is illustrated. The system contains a particle source 301, which generates a diverging particle beam 309. The latter subsequently arrives at a condenser lens system with two condenser lenses 330 and 331, which are each magnetic condenser lenses in the illustrated example. In FIGS. 2A-2C, the condenser lenses 330, 331 are indicated by ellipses. Here, a wide ellipse indicates strong excitation of the magnetic lens while a narrow ellipse, by contrast, indicates hardly any excitation or no excitation of the corresponding condenser lens. The two condenser lenses 330 and 331 form the condenser lens system or collimation lens system 303, which was also already illustrated in FIG. 1. Here, according to the prior art, the illuminating particle beam 311 which, following passage through the collimation lens system 303 arrives at the further particle-optical components, and in particular the micro-optical unit, is collimated. In the shown example, the illuminating particle beam 311 initially arrives at a pre-multi-aperture plate 380, which is used to restrict the current and which causes a formation of individual particle beams 3 when passed through. The individual particle beams 3 thus formed then pass through the further constituent parts of the micro-optical unit; here, two micro-optical correctors 353 and 354 are shown in exemplary fashion, the micro-optical correctors 353, 354 being arranged upstream of the core of the micro-optical unit, specifically the multi-aperture plate 351 and its counter electrode 352, in the example shown. Depending on the excitation of the counter electrode 352, the electric field varies during the passage through the multi-aperture plate 351 and the individual particle beams 3 are focused and pulled apart more or less strongly. Then, the focused individual particle beams 3 arrive at a field lens system 307, which is indicated by a single field lens in the illustrated example. A controller (not illustrated) ensures that the condenser lens system with the condenser lenses 330 and 331 can be driven in different ways. In the process, the condenser lenses 330 and 331 are excited to different extents. Depending on the actuation, the illuminating particle beam 311 is expanded more or less strongly, as indicated in FIGS. 2A-2C by the wide double-headed arrows. Here, the characteristic of the actual particle source 301 is assumed to be unchanging. This means that the number of charged particles emitted in total by the particle source or the associated particle flux per unit time is assumed to be constant. As a result of the different expansion of the illuminating particle beam 311, there consequently is a change in the beam current density, i.e., the number of charged particles per unit area and unit time. It is possible in each case to assign a certain fraction of all charged particles to one of the individual particle beams 3 thus formed. In the case of otherwise mechanically identical apertures, decisively set here by the opening diameter of the openings in the pre-multi-aperture plate 380, the different expansion of the illuminating particle beam 311 generates a variation in the current intensity per individual particle beam. In this case, the situations in FIG. 2A and FIG. 2B show equivalent options of how a comparatively large beam current is achieved for individual particle beams: According to FIG. 2A), the condenser lens 330 is strongly excited and the condenser lenses 331 are practically deactivated. In FIG. 2B), both condenser lenses 330, 331 have approximately the same excitation, specifically average excitation. Consequently, the current density of the illuminating particle beam 311 is identical in the two cases of FIG. 2A) and FIG. 2B); the same applies to the current intensity of the generated individual particle beams 3. By contrast, FIG. 2C) shows an illumination of the micro-optical unit with a low beam current density: To this end, the first condenser lens 330 is practically not excited while, by contrast, the second condenser lens 331 is excited very strongly. This results in a strongly expanded illuminating particle beam 311, which arrives at identical apertures in the pre-multi-aperture plate 380 and downstream elements of the micro-optical unit. Consequently, the current intensity of the individual particle beams as per the configuration in FIG. 2C) is reduced. By varying the excitations of the first and second condenser lenses 330, 331, it is possible, for instance, to realize a zoom factor of 4×, allowing for a beam current variation by approximately a factor of 15.

In addition to the current variation via different excitations of condenser lenses or collimation lens systems, further relationships are well known: By way of example, it is possible to increase the focal length of the condenser lens system (cf. focal length $f_{CL}$) in order to further reduce the beam current intensity. An issue is that the column height of the overall system is drastically increased as a result thereof. The structural measures to this end are generally unacceptable (the lengthening of the overall system involves different room heights than are generally the case) and therefore do not provide a real option. By way of example, if the intention were to increase the zoom factor of the condenser system from 4× to 5× in order to achieve a beam current variation of approximately a factor of 25, the column height lengthens by approximately 30 cm to 50 cm.

In addition or as an alternative thereto, it is conceivable to reduce the aperture diameter in the micro-optical unit, in this case, e.g., the aperture diameter in the pre-multi-aperture plate 380, in order thus to obtain lower beam current intensities. However, an issue is this is that the numerical aperture is likewise reduced and this therefore leads to a deterioration in the resolution on account of diffraction effects.

There are likewise variation options in view of the particle source 301: In general, lower current intensities can be achieved with a smaller particle source. However, replacing the particle source ("tip") involves maintenance times which are unwanted. A further approach lies in varying the extractor potential, which renders a beam current variation by approximately a factor of 2 possible. However, varying the extractor potential leads can lead to undesirable drifts of the beam current intensity.

It is possible to reduce the diameter of the apertures of the micro-optical unit and, at the same time, increase the object distance of the objective lens or the distance between the multi-intermediate image of the particle source and the sample. In general, this allows lower beam currents and also an adaptation of the numerical aperture to optimal values. However, these features can come at the price that the distance between the generated individual particle beams varies greatly on the sample. Moreover, this would also greatly increase the height of the overall system or the column height, which, once again, is not acceptable under the given circumstances in the laboratory. Besides, this would also lead to significant variation in the pitch of the beams on the sample, which is undesirable in general.

It is also possible to reduce the aperture diameter in the micro-optical unit and, at the same time, reduce the focal length of the micro-optical unit. In general, this likewise facilitates lower beam current intensities and an adaptation of the numerical aperture to a good resolution. However, the beam pitch also varies greatly in these cases. In order to counteract the change in the pitch on account of the change in the focal length of the micro-optical unit, a mechanical change would be involved, making the system overall very inflexible.

Figure 3:
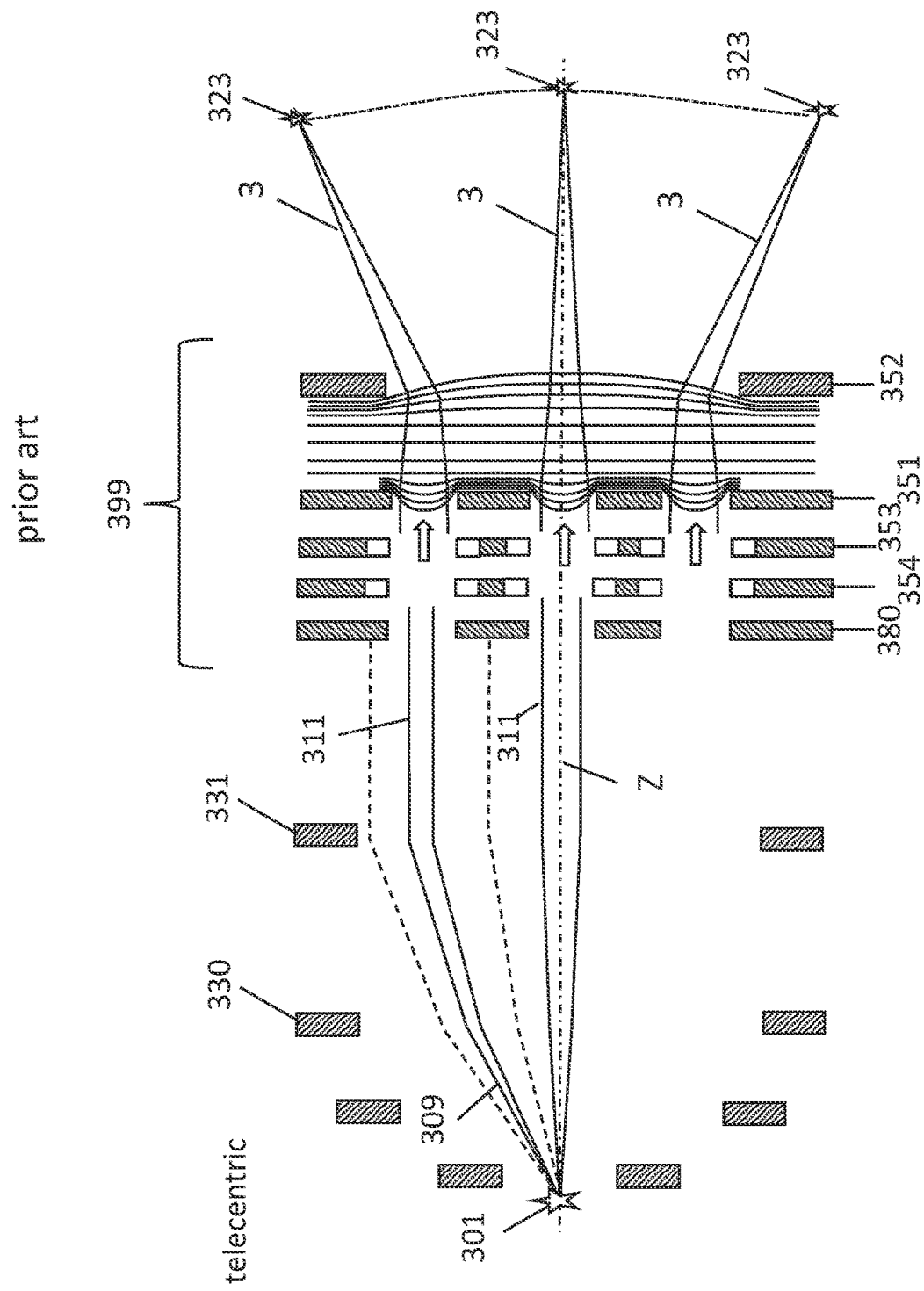
FIG. 3 schematically shows the illumination of a micro-optical unit via a condenser lens system in accordance with the prior art.

FIG. 3 schematically shows the illumination of a micro-optical unit 399 via a condenser lens system 303 in accordance with the prior art: In comparison with FIGS. 2A-2C, the beam paths of the illuminating particle beam 311 and of the individual particle beams 3 are more clearly identifiable in FIG. 3. The illuminating particle beam 311 is represented by a plurality of trajectories. Parts of the illuminating particle beam 311 pass through the pre-multi-aperture plate 380, which forms the first component of the micro-optical unit 399 in the example shown. FIG. 3 shows some equipotential lines of the electric field within the micro-optical unit and it is possible to identify overall a focusing effect of the micro-optical unit 399, more specifically a focusing effect on the individual particle beams 3 when passing through the multi-aperture plate 351 on account of the electric field applied to the counter electrode 352, which causes a change in the electric field in the region of the multi-aperture plate 351. The individual particle beams are pulled apart by the global lens field of the counter electrode 352 before the individual particle beams are focused in the foci 323. In FIG. 3, the components of the illuminating particle beam 311 arrive at the pre-multi-aperture plate 380 in telecentric fashion, which simplifies the subsequent passage through the remaining particle-optical components of the micro-optical unit 399 and further components of the overall system (not illustrated).

With this proviso, the present disclosure facilitates setting the respective optimum of beam current and numerical aperture for an optimal resolution, independently and over large value ranges, to be precise, in particular, in a simple fashion and without making structural modifications to the particle beam system. In so doing, there need not be a substantial change in the column height. In particular, the present disclosure facilitates the variation of the beam current intensity of each individual beam by more than a factor of 15, such as by more than a factor of 25, without having to lengthen the column height in the process. In one example, it is possible to obtain a variation in the beam current intensity of each individual beam by more than a factor of 50, for example a factor of 100.

Figure 4:
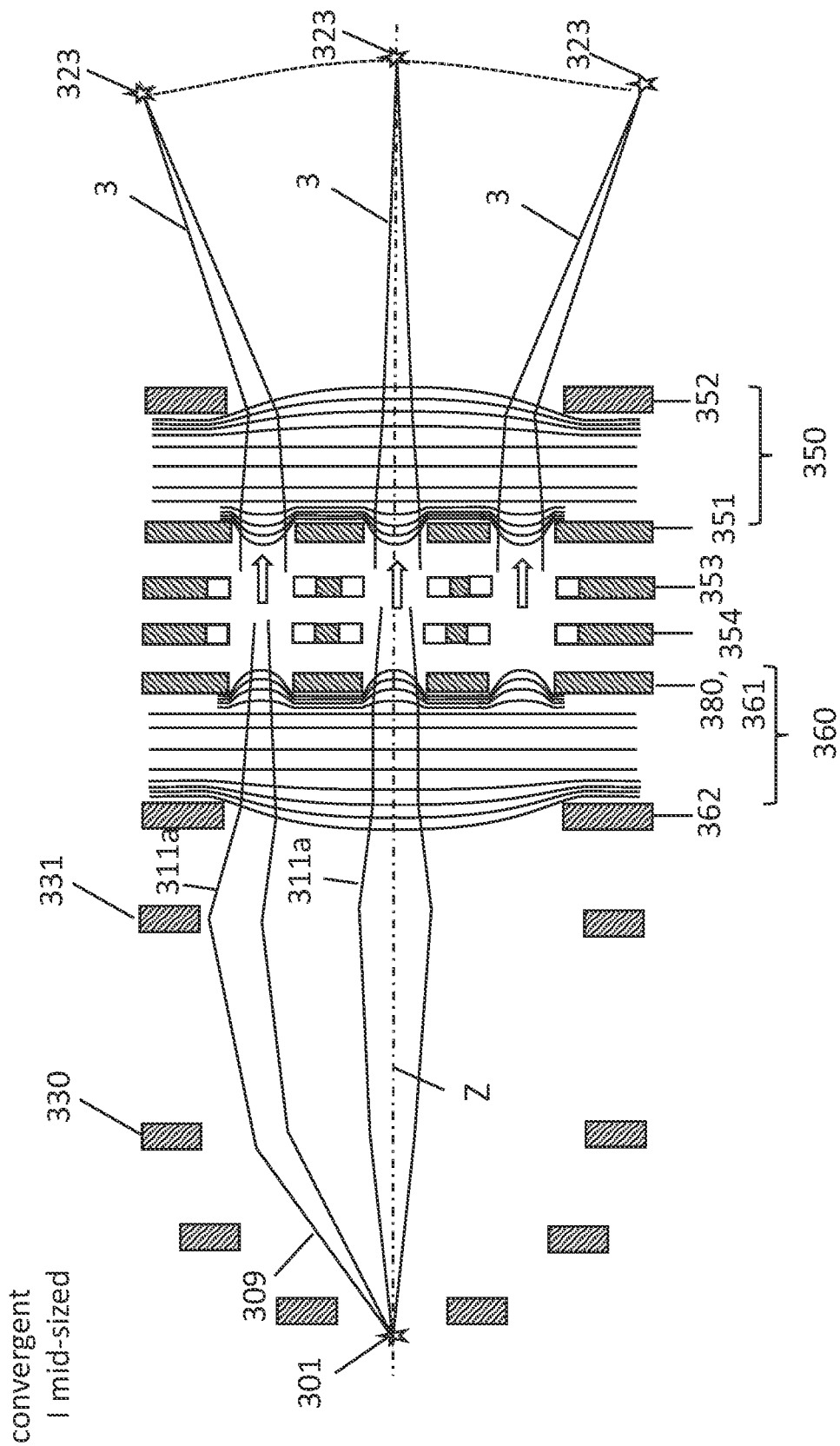
FIG. 4 schematically shows an embodiment of the disclosure with convergent beam guidance downstream of the condenser lens system.

FIG. 4 now schematically shows an embodiment of the disclosure with convergent beam guidance downstream of the condenser lens system with the magnetic condenser lenses 330 and 331. Following the passage through the condenser lens system, the illuminating beam 311a is convergent and a portion of charged particles emerging from the same solid angle of the particle source 301 is compacted, as it were, such that the beam current intensity of an individual particle beam formed from this solid angle increases. The greater the convergence, the higher the beam current density. However, it can remain desirable to illuminate the micro-optical unit starting with the pre-multi-aperture plate 380 in the example shown in telecentric fashion. This is enabled by the provision of an additional pre-counter electrode 362 between the condenser lens 331 and the pre-multi-aperture plate 380, 361. A controller (not illustrated) is configured to supply adjustable voltages to the condenser lens system 330, 331 and the pre-counter electrode 362 in such a way that the charged particles are able to be incident on the pre-multi-aperture plate 361 in telecentric fashion. In FIG. 4, this telecentricity condition can be identified on the central individual particle beam or the associated beam trajectories. In the region of the optical axis Z, the trajectories of the particle beams are parallel upon incidence on the pre-multi-aperture plate 361. The telecentricity condition is also satisfied away from the optical axis (e.g., upper trajectory), but this cannot be identified in the drawing on account of the simplified schematic illustration. In the present case, the desired effect of the telecentric incidence is achieved by a combination of the global lens field, which is generated by the pre-counter electrode 362, with the local lens field of the pre-multi-aperture plate 361. Overall, this yields a focusing effect, which is added to the focusing effect of the system combination of multi-lens array 351 and counter electrode 352. This also shortens the focal length of the micro-optical unit; i.e., in FIG. 4, the foci 323 are shifted further to the left in the direction of the optical axis Z. In FIG. 4, the multi-lens array 350 and the pre-multi-lens array 360 according to the disclosure are constructed in mirror image to one another. A combination or targeted actuation of the pre-multi-lens array 360 in combination with an appropriately chosen actuation of the condenser lens system 330, 331 in this case enables setting of the beam current intensity. According to the exemplary embodiment in FIG. 4, the beam current intensity of the individual beams is increased such that, in addition to the increase in the beam current intensity by varying the condenser lenses 330, 331 as illustrated in FIG. 2A, a further increase in the beam current intensity is achieved without in the process increasing the installation length of the condenser lens system or the column length. Analogously, a variation of the numerical aperture in the object plane is enabled by setting the multi-lens array 350 with a suitable choice of an additional setting parameter such as that of an additional field lens 370 (cf. FIG. 12), leading overall to an improved, more particularly optimized, resolution.

Figure 5:
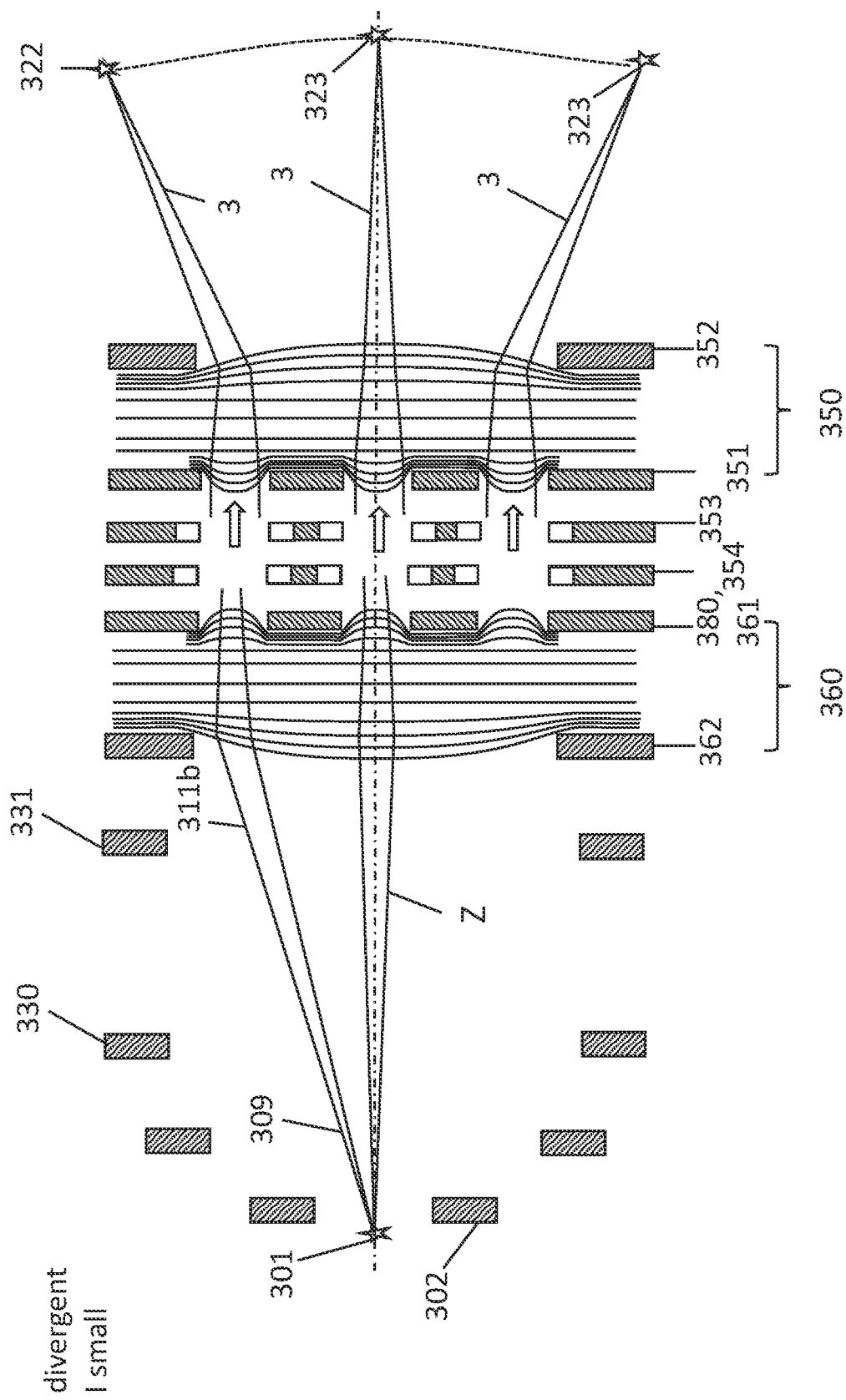
FIG. 5 schematically shows the embodiment of the disclosure shown in FIG. 4 with divergent beam guidance downstream of the condenser lens system.

While FIG. 4 illustrates a mid beam current density with convergent incoming radiation 311a, FIG. 5 shows a low beam current density with divergent beam guidance 311b. Here, the illustration in FIG. 5 is very schematic, in such a way that both condenser lenses 330, 331 are excited only very weakly such that, in the simplified sketched out illustration, the divergent particle beam 309 is practically not deflected. The divergent illuminating particle beam 311b passes through the pre-counter electrode 362. However, a different electric potential—in comparison with FIG. 4—is now applied to this pre-counter electrode 362 such that, once again, a telecentric incidence of the particle beams on the pre-multi-aperture plate 361 is achieved as a result of the chosen settings. In comparison with the example of FIG. 4, the beam current taken up by each individual particle beam 3 is smaller. The targeted actuation of the condenser lens system and, in particular, of the condenser lens 331 in combination with a specially chosen actuation of the pre-counter electrode 362 thus also allows an individual setting of the beam current in this case, which in turn facilitates the targeted improvement of the resolution of the overall system. According to the exemplary embodiment in FIG. 5, the beam current intensity of the individual beams is reduced such that, in addition to the reduction in the beam current intensity by varying the condenser lenses 330, 331 as illustrated in FIG. 2C, a further reduction in the beam current intensity is achieved without in the process increasing the installation length of the condenser lens system or the column length. Consequently, a multi-beam particle microscope with a multiplicity of individual beams is provided, in which a beam current intensity of each individual beam is changeable by more than a factor of 15, such as by more than a factor of 20, by more than a factor of 30 or by more than a factor of 50, while the numerical aperture of each individual beam remains unchanged, wherein the column length of the multi-beam particle microscope remains unchanged and, in particular, the column length is less than 1.5 meters, such as less than 1 m.

Typically, a voltage of −30 kV is applied to the emitter 301, provided the emitter emits electrons. The associated extractor 302 typically has 3 to 7 kV. The micro-optical unit itself is generally at ground potential, i.e., 0 kV. The pre-counter electrode according to the disclosure is typically operated in the range between approximately +−12 and +−20 kV. Consequently, this is of the same order of magnitude as the voltage supply of the counter electrode 352 of the multi-lens array 350. Other voltage values are possible. According to the disclosure, it is particularly the case that a controller is configured to supply adjustable voltages to the particle-optical components. To this end, it is possible, in particular, for charged particles to able to be incident on the pre-multi-aperture plate 361 in telecentric fashion. This controller can be a central controller which also controls the particle beam system overall, e.g., the controller or the computer system 10 presented in FIG. 1 of this patent application. It is possible that certain values for driving the particle-optical components are stored in a lookup table.

Figure 7:
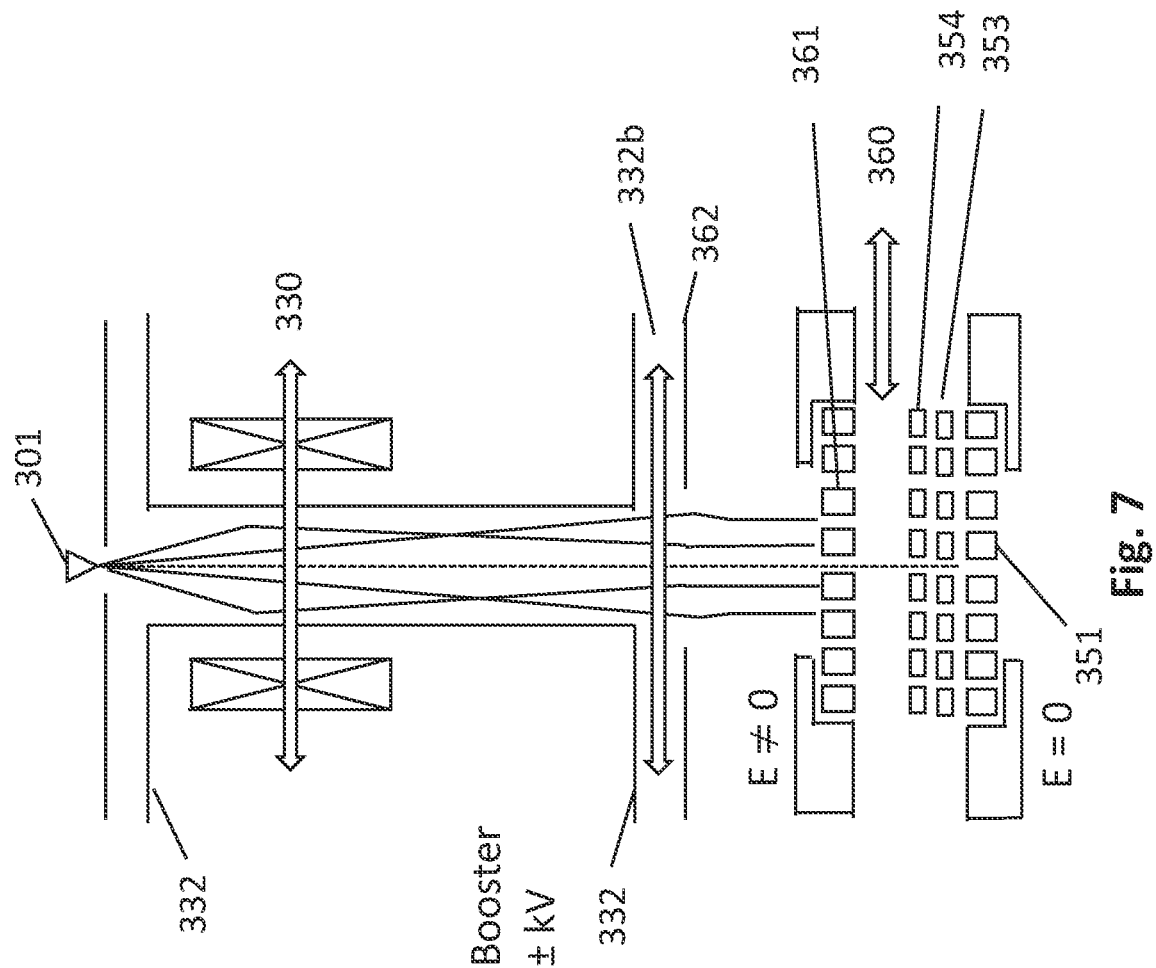
FIG. 7 schematically shows a further embodiment of the disclosure with an electrostatic condenser lens and booster electrode.

FIG. 7 schematically shows a further embodiment of the disclosure with an electrostatic condenser lens and a booster electrode 332. Here, the condenser lens system includes a magnetic condenser lens 330 and an electrostatic condenser lens 332b disposed downstream thereof. The respective excitations thereof are indicated by the double-headed arrows. A booster potential is applied between the two condenser lenses 330 and 332b via the booster electrode 332. Once again, the pre-multi-lens array 360, according to the disclosure, with the pre-counter electrode 362 and the pre-multi-aperture plate 361 is arranged in the beam path downstream of the electrostatic condenser lens 332b. The focal length of the pre-multi-lens array 360 can be set by the electric field of the pre-counter electrode 362. In combination with the pre-counter electrode 362 and the lower end of the booster electrode 332, a variable electrostatic lens is formed, which acts as a lower condenser lens 332b. Together with the cathode 301 of the emitter and a magnetic lens 330, the upper end (near the cathode) of the booster electrode 332 forms the fields for the upper condenser lens 330. The beam current can be set and the telecentric illumination condition can be established using the corresponding condenser lenses 330 and 332b.

Figure 8:
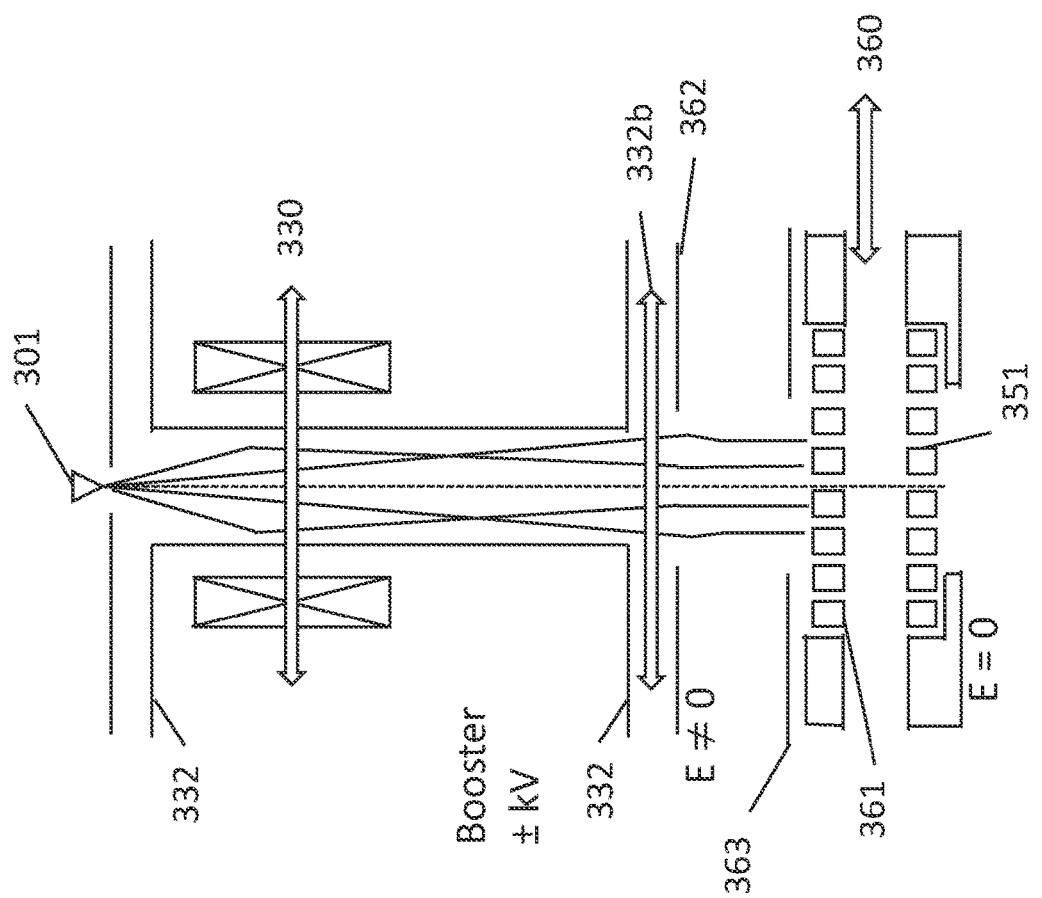
FIG. 8 schematically shows the embodiment of the disclosure shown in FIG. 7 with an additional pre-auxiliary electrode.

FIG. 8 schematically shows the embodiment of the disclosure shown in FIG. 7, supplemented by a pre-auxiliary electrode 363. By way of example, this pre-auxiliary electrode 363 can be used to correct a field curvature. Overall, the electric field E changes with different settings of the pre-auxiliary electrode 363, which leads to a focal length variation between the beams and consequently to a "negative" field curvature of the beam array. The closer the pre-auxiliary electrode is arranged to the pre-multi-aperture plate 361, the greater the effect on the resultant field curvature. Accordingly, the telecentric incidence condition on the pre-multi-aperture plate 361 can nevertheless be achieved according to the disclosure, to be precise by appropriate driving of the condenser lens system 330, 332a and of the pre-counter electrode 362.

Figure 9C:
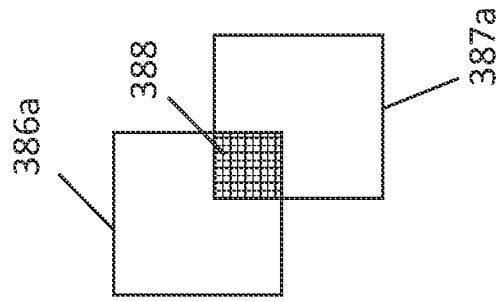
FIGS. 9A-9C schematically show a multi-aperture plate system with two or more multi-aperture plates, which are displaceable relative to one another, for beam current variation.
Figure 9B:
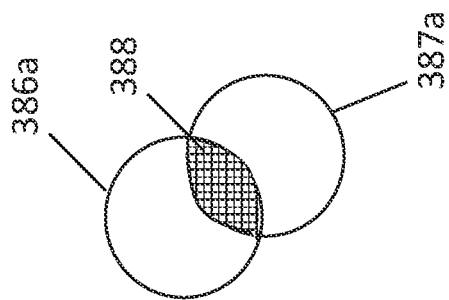
Figure 9A:
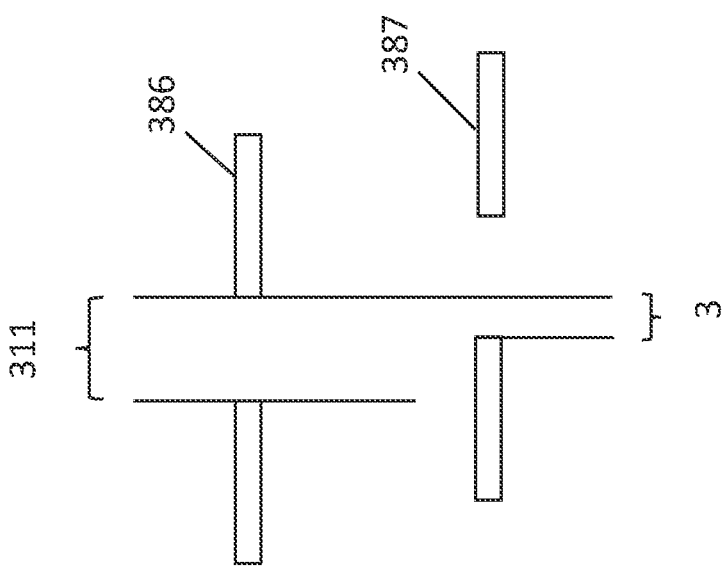

FIGS. 9A-9C schematically show a multi-aperture plate system with two or more multi-aperture plates 386, 387, which are displaceable relative to one another, for beam current variation. The multi-aperture plate system is embodied to be insertable into the beam path, which already emerges from the fact that at least one of the multi-aperture plates 386, 387 is displaceable relative to the particle beam system or the particle beam generated therein. A so-called slide-in aperture 399 can be arranged as shown in, e.g., FIG. 6: The insertable, beam current-restricting multi-aperture plate system 385 is situated between the pre-multi-lens array 360 and the multi-lens array 350 and consequently between the pre-multi-aperture plate 361 and the multi-aperture plate 351, optionally upstream of the micro-optical correctors 354, 353 downstream of the pre-multi-aperture plate 361, but outside of the multi-lens fields 398. The relative displaceability of the two multi-aperture plates 386 and 387 with respect to one another can be achieved via an appropriate mechanism and actuators, for example piezo actuators. Here, the accuracy of the positioning of the multi-aperture plates 386, 387 is of the order of approximately one micrometer. It is possible to reduce the beam current by a further factor (approximately a factor of 6) with the aid of a correspondingly variably insertable aperture. Here, one of the two multi-aperture plates 386, 387 can also be identical to the pre-multi-aperture plate 361 already described above. However, this need not be the case. In a lateral view with multi-aperture plates 386 and 387 offset relative to one another, FIG. 9A-9C show how the illuminating beam 311 results in an individual particle beam 3 with a defined diameter. The further the two plates 386, 387 are displaced relative to one another, the narrower the diameter of the individual particle beam 3 becomes and the lower the current intensity is in the individual particle beam 3.

Here, the openings of the multi-aperture plates 386, 387 which are displaceable relative to one another can have substantially the same size and substantially the same geometric form. FIGS. 9B) and 9C) show two examples. According to FIG. 9B), the openings 386, 387a are each round or circular. Displaced relative to one another, this yields a so-called lens shape 388. This lens shape can be approximated by an elliptic form, which is why such realization can be combined with a multi-stigmator in order to re-obtain circular beam cross sections. The embodiment variant as per FIG. 9C) shows square openings 386a and 387a. In this case, the resultant opening 388 can likewise be square provided the offset of the two multi-aperture plates 486 and 387 relative to one another is chosen and scaled accordingly.

Figure 10:
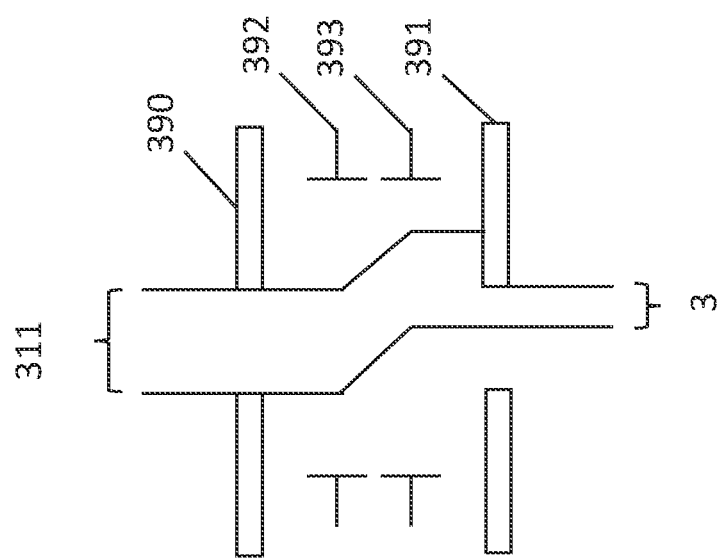
FIG. 10 schematically shows a multi-aperture plate system with two sequentially disposed multi-aperture plates and a deflector system located therebetween for beam current variation.

FIG. 10 schematically shows a multi-aperture plate system with two sequentially disposed multi-aperture plates 390, 391 and a deflector system located therebetween for beam current variation. A double deflector with the individual deflectors 392 and 393 is illustrated. These facilitate a parallel offset of the illuminating beam 311 incident on the multi-aperture plate 393. If the deflector system 392, 393 is deactivated and the two multi-aperture plates 390 and 391 are aligned accordingly, i.e., their respective openings are of equal size and located centrally over one another, the entire beam 311 passes through the multi-aperture plate system and this results in an individual particle beam 3 with a maximum particle beam diameter. By contrast, if the deflectors 392, 393 are activated, this implements the parallel offset of the particle beams and the offset particle beam partly impinges the second multi-aperture plate 391 and only passes through the latter in part. This results in an individual particle beam 3 with reduced diameter and overall reduced current intensity.

Figure 6:
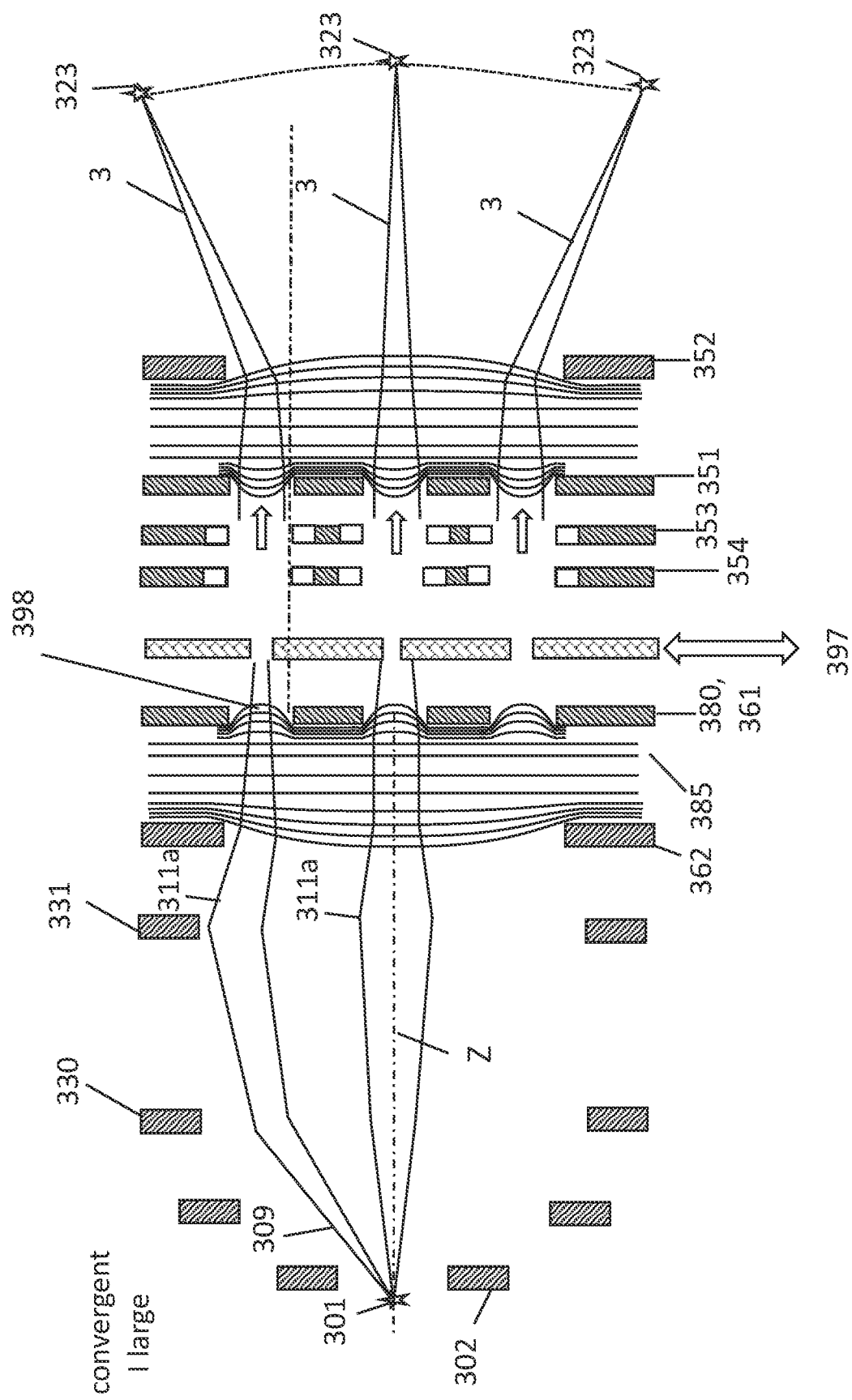
FIG. 6 schematically shows a further embodiment of the disclosure with a beam current-restricting multi-aperture plate system.

In one example, the individual beam current intensity is varied by varying the excitation of the condenser lenses, as illustrated in FIGS. 2A to 2C, together with the variation of the openings of the multi-aperture plates 386 and 387 or two sequentially disposed multi-aperture plates 390, 391 and a deflector system located therebetween for beam current variation, and an individual beam current variation by a factor of more than 20, for example a factor of 30 or a factor of 50, is achieved, without increasing the column length of the multi-beam particle microscope. In one example, the individual beam current intensity is varied by varying the excitation of the condenser lenses, as illustrated in FIGS. 2A to 2C, together with the variation of the excitation of the pre-counter electrode 362, as illustrated in FIGS. 5 and 6, and together with the variation of the openings of the multi-aperture plates 386 and 387 or two sequentially disposed multi-aperture plates 390, 391 and a deflector system located therebetween for beam current variation, and an individual beam current variation by a factor of more than 30, for example a factor of 50 or a factor of 100, is achieved, without increasing the column length of the multi-beam particle microscope.

Figure 11C:
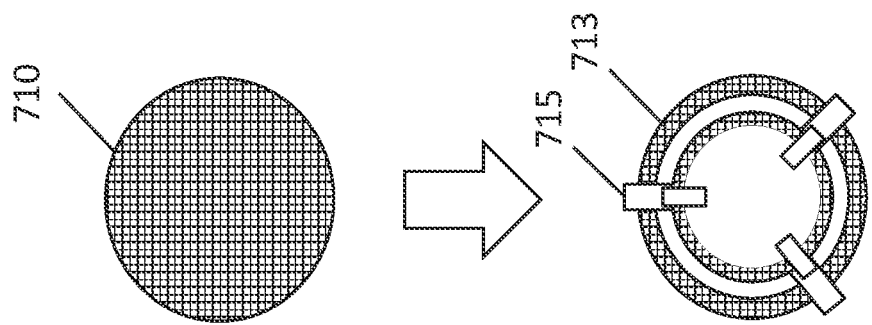
FIGS. 11A-11C schematically show various apertures for beam current variation.
Figure 11B:
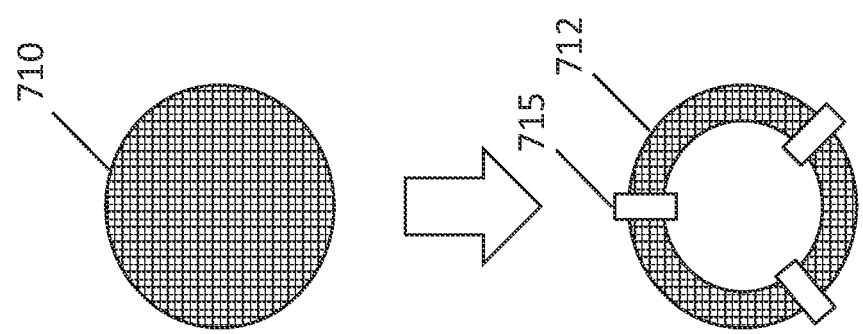
Figure 11A:
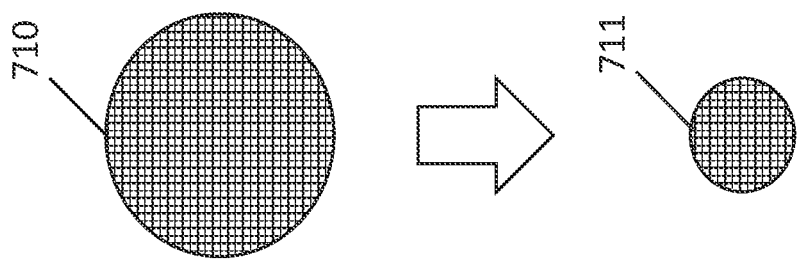

FIGS. 11A-11B schematically show various apertures for beam current variation which can be used, for example, in the described beam current-restricting multi-aperture plate system. FIG. 11A) initially shows a circular beam cross section 710. If the beam current intensity is reduced via an aperture, this can be implemented as per FIG. 11A) via a circular opening. However, the limited current in the case of the smaller aperture 711 reduces the individual beam aperture, leading to a reduced resolution. In comparison therewith, the arrangement of FIG. 11B) offers a better solution approach: Here, the current is limited by the annular aperture 712 while the maximum opening diameter is the same. The central shading stop is held by fine, mechanical connections in this case. The lateral resolution is maintained when the annular aperture is used. If a conventional circular aperture is compared to an annular aperture, it is noticeable that the annular opening generates a Bessel beam with an even smaller central maximum, and hence a higher resolution. However, this comes at the price of a high secondary maxima such that, in individual cases, the use of a conventional circular aperture should be weighed against the use of an annular aperture. FIG. 11C) shows an aperture with two annular apertures. The central shading stop and the annular stop are once again held by webs 715. The illustrated aperture is also referred to as a Toraldo filter. It achieves a similar diffraction maximum as an annular opening but has less high secondary maxima in comparison with a single annular aperture. The use of annular apertures, in particular of a system of at least two annular apertures arranged within one another, enables a further reduction in the individual beam currents while the numerical aperture and hence the resolution remain unchanged, without increasing the column length of the multi-beam particle microscope. In particular, an unchanged resolution can be ensured by digital image processing downstream of the imaging, for example a deconvolution operation of the raw image data obtained using the convolution kernel that corresponds to the diffraction image of the annular apertures, in particular the system of at least two annular apertures arranged within one another.

FIG. 12 schematically shows, with much simplification, a multi-beam particle microscope 1 with particle-optical components for setting an optimal resolution. Proceeding from a particle source 301, which emits electrons, for example, charged particles pass through a condenser lens system 303, which has two magnetic condenser lenses 330, 331 in the shown example, each of which can be driven by a controller (not illustrated). Thereupon, the charged particles pass through the pre-multi-lens array 360 and, subsequently, the multi-lens array 350 in the downstream beam path. Here, the pre-multi-lens array 360 and the multi-lens array 350 have a substantially mirrored embodiment with respect to one another. The pre-multi-lens array 360 includes the pre-counter electrode 362 and the pre-multi-aperture plate 361. The multi-lens array 350 includes the multi-aperture plate 351 and the counter electrode 352. In this case, the pre-counter electrode 362 and the counter electrode 352 are driven by way of the controller (not illustrated) and fed with appropriate potentials. An appropriate actuation allows the current intensity of the individual particle beams 3 to be varied, as described in more detail above. The focal length or the position of the foci 323, 323a in the intermediate image plane E1 is varied by a variation of the voltage applied to the counter electrode 352. Here, there is change both in the pitch of the foci in the intermediate image plane E1 and—in the case of appropriate driving of the particle-optical components—in the position of the plane E1 in relation to the optical axis Z of the system (not plotted). The foci 323, 323a in the intermediate image plane E1 can be considered to be multiple images of the particle source 301. Consequently, they form virtual particle sources 323, 323a. Here, the full lines illustrate a particle beam 3; the dash-dotted line by contrast illustrates a particle beam 3a in the case of altered adjustment conditions of the counter electrode 352. The altered focal position in the intermediate image plane E1 is indicated by the stars 323a—in contrast to the circles 323.

A field lens system 307 consisting of three field lenses and, downstream thereof, a beam switch 400 and an objective lens 102, in particular a magnetic objective lens in this case, are situated in the beam path downstream of the intermediate image plane E1. As a result, the charged individual particle beams 3 are imaged from the intermediate image plane E1 onto the object plane E2 in particle-optical fashion. The numerical aperture of the individual particle beams upon incidence on the object plane E2 can be altered by a variation in the position of the foci 323, 323a in the intermediate image plane E1 and an optionally implemented displacement of the intermediate image plane E1 in the direction of the optical axis Z (not illustrated), with it being possible to keep the pitch between the individual particle beams (pitch 2) in the object plane E2 constant. This additional condition of keeping the pitch 2 in the object plane E2 constant can be achieved by the provision of an additional field lens 370 which, in the shown example, is arranged between the intermediate image plane E1 and the field lens system 307 consisting of three field lenses. The remaining particle-optical parameters such as focus, rotation and/or telecentricity in the object plane can likewise be kept constant.

The secondary particle beams 9 emanating from by a sample 7 then pass through a projection lens 205 and a stop 210, and finally arrive at a particle multi-detector 209. Here, on account of two additional global particle-optical components, the illustrated multi-beam particle microscope 1 allows a comprehensive improvement and possible optimization of the resolution in particle-optical imaging. Firstly, targeted driving of the condenser lens system 303 in combination with targeted driving of the pre-counter electrode 362 enables targeted adjustment of the current intensity of the individual particle beams. The telecentricity condition upon incidence on the micro-optical unit or, represented in simplified fashion here, on the pre-multi-aperture plate 361, which may be desired for the subsequent particle-optical imaging, can be achieved. In the further course, targeted driving of the counter electrode 352 in combination with the additional field lens 370 then enables a change in the numerical aperture in the object plane E2, without altering the pitch 2 in the object plane in the process. Consequently, the additional field lens 370 represents a particle-optical variation component and introduces the additional degree of freedom into the system in order to facilitate this detailed setting.

In one example, the targeted driving of the counter electrode 352 in combination with the additional field lens 370 enables at least an approximate keeping constant of the numerical aperture of the individual beams of combination with the variation in the openings of the multi-aperture plates 386 and 387 as per one of the exemplary embodiments according to FIGS. 9A-9C or two sequentially arranged multi-aperture plates 390, 391 and a deflector system situated therebetween as per the exemplary embodiment according to FIG. 10. Consequently, a multi-beam particle microscope with a multiplicity of particle beams is provided, which is designed for a variation in the beam current intensities of the individual beams by more than a factor of 20, for example by a factor of 30, 50 or even 100, with the column length of the multi-beam particle microscope being constant and being less than 1.5 m, such as less than 1 m, in length and the resolution of each individual beam remaining approximately constant when the beam current intensity is altered.

It is possible to combine the illustrated multi-beam particle microscope with further particle-optical components. In this respect, the illustrated embodiment should be understood as being purely exemplary.

LIST OF REFERENCE SIGNS

1 Multi-beam particle microscope
3 Primary particle beams (individual particle beams)
3a Primary particle beams (individual particle beams)
5 Beam spots, sites of incidence
7 Object
9 Secondary particle beams
10 Computer system, controller
100 Objective lens system
101 Object plane
102 Objective lens
103 Field
200 Detector system
205 Projection lens
209 Particle multi-detector
210 Stop
211 Detection plane
213 Sites of incidence
217 Field
300 Beam generating apparatus
301 Particle source
302 Extractor
303 Collimation lens system or condenser lens system
305 Multi-aperture arrangement
313 Multi-aperture plate
315 Openings of the multi-aperture plate
317 Midpoints of the openings
319 Field
307 Field lens system
309 Diverging particle beam
311 Illuminating particle beam
323 Beam foci
323a Beam foci
325 Intermediate image plane
330 Condenser lens (magnetic)
331 Condenser lens (magnetic)
332 Condenser lens (electrostatic)
333 Booster potential
350 Multi-lens array
351 Multi-aperture plate
351 Counter electrode
353 Micro-optical corrector, in particular multi-stigmator
354 Micro-optical corrector, in particular focusing multi-lens array
355 Frame
360 Pre-multi-lens array
361 Pre-multi-aperture plate
362 Pre-counter electrode
363 Pre-auxiliary electrode
370 Additional field lens
380 Pre-multi-aperture plate
385 Insertable, beam current-restricting multi-aperture plate system
386 First multi-aperture plate
386a Opening in the first multi-aperture plate
387 Second multi-aperture plate
387a Opening in the second multi-aperture plate
388 Effective opening
390 First multi-aperture plate
391 Second multi-aperture plate
392 First deflector
393 Second deflector
397 Insertable multi-aperture plate system
398 Multi-lens field
399 Micro-optical unit
400 Beam switch
410 Beam tube
710 Circular beam cross section
711 Circular aperture
712 Annular aperture
713 Toraldo filter
715 Web
E1 Intermediate image plane
E2 Object plane
Z Optical axis
Z.P 1308 TW

What is claimed is:

1. A particle beam system, comprising:
a particle source configured to generate a divergent beam of charged particles having a beam path through the particle beam system;
a condenser lens system configured so that the beam of charged particles passes through the condenser lens during use of the particle beam system;
a pre-multi-lens array comprising a pre-counter electrode and a pre-multi-aperture plate, the pre-counter electrode comprising a central opening through which the beam of charged particles passes during use of the particle beam system, the pre-multi-aperture plate being arranged in the beam path downstream of the pre-counter electrode, the pre-multi-aperture plate being arranged so that the charged particles pass therethrough in the form of a multiplicity of charged individual particle beams during use of the particle beam system;
a multi-lens array in the beam path downstream of the pre-multi-lens array, the multi-lens array comprising a multi-aperture plate and a counter electrode, the multi-aperture plate comprising a multiplicity of openings through which at least a portion of the charged individual particle beams pass during use of the particle beam system, and the counter electrode comprising a central opening disposed in the beam path downstream of the multi-aperture plate, the counter electrode being substantially passed through by the multiplicity of individual particle beams during use of the particle beam system; and
a controller configured to supply adjustable excitations to the condenser lens system and the pre-counter electrode to control a current intensity of the individual particle beams so that, during use of the particle beam system, the beam of charged particles enters a global lens field of the pre-counter electrode in a convergent fashion or a divergent fashion and the beam of charged particles is incident on the pre-multi-aperture plate in telecentric fashion.

2. The particle beam system of claim 1, wherein the controller is configured to set a current intensity of the individual particle beams.

3. The particle beam system of claim 1, comprising a micro-optical unit comprising the multi-lens array.

4. The particle beam system of claim 3, wherein the micro-optical unit comprises a frame at ground potential.

5. The particle beam system of claim 3, wherein the micro-optical unit comprises the pre-multi-aperture plate.

6. The particle beam system of claim 1, further comprising a pre-auxiliary electrode comprising a central opening in the beam path downstream of the pre-counter electrode and just upstream of the pre-multi-aperture plate, wherein the controller is configured to supply an adjustable voltage to the central opening of the pre-auxiliary electrode.

7. The particle beam system of claim 1, further comprising a post-auxiliary electrode comprising a central opening in the beam path just downstream of the multi-aperture plate and upstream of the counter electrode, wherein the controller is configured to supply an adjustable voltage to the central opening of the post-auxiliary electrode.

8. The particle beam system of claim 1, wherein the condenser lens system comprises two condenser lenses.

9. The particle beam system of claim 8, wherein both condenser lenses are magnetic condenser lenses.

10. The particle beam system of claim 1, wherein:
the condenser lens system comprises a magnetic condenser lens and an electrostatic condenser lens;
the electrostatic condenser lens is in the beam path downstream of the magnetic condenser lens;
the particle beam system comprises a booster electrode between the magnetic condenser lens and the electrostatic condenser lens;
the controller is configured to drive the booster electrode; and
the booster electrode is configured to excite the electrostatic condenser lens.

11. The particle beam system of claim 1, further comprising a beam current-restricting multi-aperture plate system comprising a beam current-restricting multi-aperture plate which comprises a multiplicity of openings, wherein the beam current-restricting multi-aperture plate system is insertable into the beam path downstream of the pre-multi-lens array and upstream of the multi-lens array.

12. The particle beam system of claim 11, wherein the beam current-restricting multi-aperture plate system comprises two or more beam current-restricting multi-aperture plates which are displaceable in substantially parallel fashion relative to one another, each with a multiplicity of openings, so that an effective multi-aperture plate opening size is adjustable for the individual particle beams passing through the beam current-restricting multi-aperture plate system during use of the particle beam system.

13. The particle beam system of claim 12, wherein the openings of the beam current-restricting multi-aperture plates are circular or square.

14. The particle beam system of claim 11, wherein:
the beam current-restricting multi-aperture plate system comprises two beam current-restricting multi-aperture plates disposed sequentially in the beam path, each with a multiplicity of openings; and
the particle beam system comprises two deflectors between the two beam current-restricting multi-aperture plates;
the two deflectors are drivable to parallelly displace individual particle beams with respect to an optical axis when the individual particle beams pass through the multi-aperture plate system during use of the particle beam system.

15. The particle beam system of claim 11, wherein the openings of the beam current-restricting multi-aperture plate have substantially the same size and geometric form.

16. The particle beam system of claim 11, wherein the openings of the beam current-restricting multi-aperture plate are circular and/or annular.

17. The particle beam system of claim 1, wherein:
the particle beam system has an intermediate image plane downstream of the multi-lens array in a direction of the beam path;
real foci of the individual particle beams are formed in the intermediate image plane during use of the particle beam system;
the foci are spaced apart by a pitch in the intermediate image plane;
the particle beam system comprises a field lens system downstream of the multi-lens array in the direction of the beam path;
the particle beam system comprises an objective lens downstream of the field lens system in the direction of the beam path;
the particle beam system has an object plane in which the individual particle beams are imaged particle-optically during use of the particle beam system; and
the individual particle beams are spaced apart by a pitch in the object plane.

18. The particle beam system of claim 17, wherein the controller is configured to control the particle beam system to set the pitch in the object plane.

19. The particle beam system of claim 17, wherein the controller is configured to control the particle beam system to set a numerical aperture in the object plane to optimize a resolution in the object plane for a beam current of the individual particle beams.

20. A method, comprising:
using the particle beam system of claim 1 to: a) set a current intensity of individual particle beams; or b) set a resolution in an object plane of the particle beam system.

21. A microscope, comprising:
the particle beam system according to claim 1,
wherein the microscope is a multi-beam particle microscope.

* * * * *

UNITED STATES PATENT AND TRADEMARK OFFICE
CERTIFICATE OF CORRECTION

PATENT NO. : 12,119,204 B2
APPLICATION NO. : 17/573222
DATED : October 15, 2024
INVENTOR(S) : Stefan Schubert et al.

It is certified that error appears in the above-identified patent and that said Letters Patent is hereby corrected as shown below:

On the Title Page

Column 2, Item (57), Line 7, delete "includes" insert -- include --.

In the Specification

Column 1, Line 11, delete "Mar." insert -- May --.

Column 10, Line 60, delete "there" insert -- their --.

Column 11, Line 58, delete "excerpt 13" insert -- excerpt $I_3$ --.

Signed and Sealed this
Tenth Day of December, 2024

Katherine Kelly Vidal
*Director of the United States Patent and Trademark Office*